United States Patent
Kushibe et al.

(10) Patent No.: US 9,269,868 B2
(45) Date of Patent: Feb. 23, 2016

(54) SEMICONDUCTOR LIGHT EMITTING ELEMENT AND METHOD FOR MANUFACTURING SEMICONDUCTOR LIGHT EMITTING ELEMENT

(71) Applicant: Kabushiki Kaisha Toshiba, Minato-ku (JP)

(72) Inventors: Mitsuhiro Kushibe, Setagaya (JP); Kei Kaneko, Yokohama (JP); Yasuo Ohba, Yokosuka (JP); Hiroshi Katsuno, Komatsu (JP); Shinji Yamada, Nonoichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/468,505

(22) Filed: Aug. 26, 2014

(65) Prior Publication Data

US 2015/0084069 A1    Mar. 26, 2015

(30) Foreign Application Priority Data

Sep. 24, 2013   (JP) .................................. 2013-197489

(51) Int. Cl.
*H01L 27/15* (2006.01)
*H01L 33/32* (2010.01)
(Continued)

(52) U.S. Cl.
CPC ............ *H01L 33/32* (2013.01); *H01L 33/0075* (2013.01); *H01L 33/04* (2013.01)

(58) Field of Classification Search
None
See application file for complete search history.

(56) References Cited

U.S. PATENT DOCUMENTS 6,337,493 B1    1/2002  Tanizawa et al.
7,348,602 B2    3/2008  Tanizawa
(Continued)

FOREIGN PATENT DOCUMENTS

JP    2000-307149 A    11/2000
JP    2001-148507 A    5/2001
(Continued)

OTHER PUBLICATIONS

Hideki Hirayama et al., "Marked Enhancement in the Efficiency of Deep-Ultraviolet AlGaN Light-Emitting Diodes by Using a Multiquantum-Barrier Electron Blocking Layer", Applied Physics Express 3, (2010), 4 pages.

(Continued)

*Primary Examiner* — Bilkis Jahan
(74) *Attorney, Agent, or Firm* — Oblon, McClelland, Maier & Neustadt, L.L.P.

(57) ABSTRACT

According to one embodiment, a semiconductor light emitting element includes an n-type semiconductor layer including a nitride semiconductor, a p-type semiconductor layer including a nitride semiconductor, a light emitting unit, a first layer, a second layer, and a third layer. The light emitting unit is provided between the n-type and p-type semiconductor layers, and includes a first well layer including a nitride semiconductor. The first layer is provided between the first well layer and the p-type semiconductor layer, and includes $Al_{x1}Ga_{1-x1-y1}In_{y1}N$ having a first Mg concentration. The second layer is provided between the first layer and the p-type semiconductor layer, and includes $Al_{x2}Ga_{1-x2-y2}In_{y2}N$ having a second Mg concentration higher than the first Mg concentration. The third layer is provided between the second layer and the p-type semiconductor layer, and includes $Al_{x3}Ga_{1-x3-y3}In_{y3}N$ having a third Mg concentration higher than the first Mg concentration and lower than the second Mg concentration.

32 Claims, 15 Drawing Sheets

(51) Int. Cl.
*H01L 33/00* (2010.01)
*H01L 33/04* (2010.01)

(56) References Cited

U.S. PATENT DOCUMENTS

| | | |
|---|---|---|
| 2005/0145860 A1 | 7/2005 | Tanizawa |
| 2007/0096077 A1 | 5/2007 | Sanga et al. |
| 2011/0198561 A1 | 8/2011 | Tachibana et al. |
| 2012/0049157 A1* | 3/2012 | Nago et al. ............... 257/13 |
| 2012/0138889 A1* | 6/2012 | Tachibana et al. ......... 257/13 |
| 2013/0122626 A1 | 5/2013 | Nago et al. |
| 2013/0292644 A1 | 11/2013 | Tachibana et al. |
| 2014/0110667 A1 | 4/2014 | Tachibana et al. |
| 2014/0153602 A1* | 6/2014 | Tachibana et al. ........ 372/44.01 |

FOREIGN PATENT DOCUMENTS

| | | |
|---|---|---|
| JP | 2003-115642 A | 4/2003 |
| JP | 2011-171369 | 9/2011 |
| JP | 2012-119515 A | 6/2012 |
| JP | 5060656 B2 | 8/2012 |
| WO | WO 2007/052628 A1 | 5/2007 |
| WO | WO 2011/077473 A1 | 6/2011 |

OTHER PUBLICATIONS

Ray-Ming Lin et al., "Inserting a p-InGaN Layer Before the p-AlGaN Electron Blocking Layer Suppresses Efficiency Drop in InGaN-based Light-emitting Diodes", Applied Physics Letters, (2012), 4 pages.

* cited by examiner

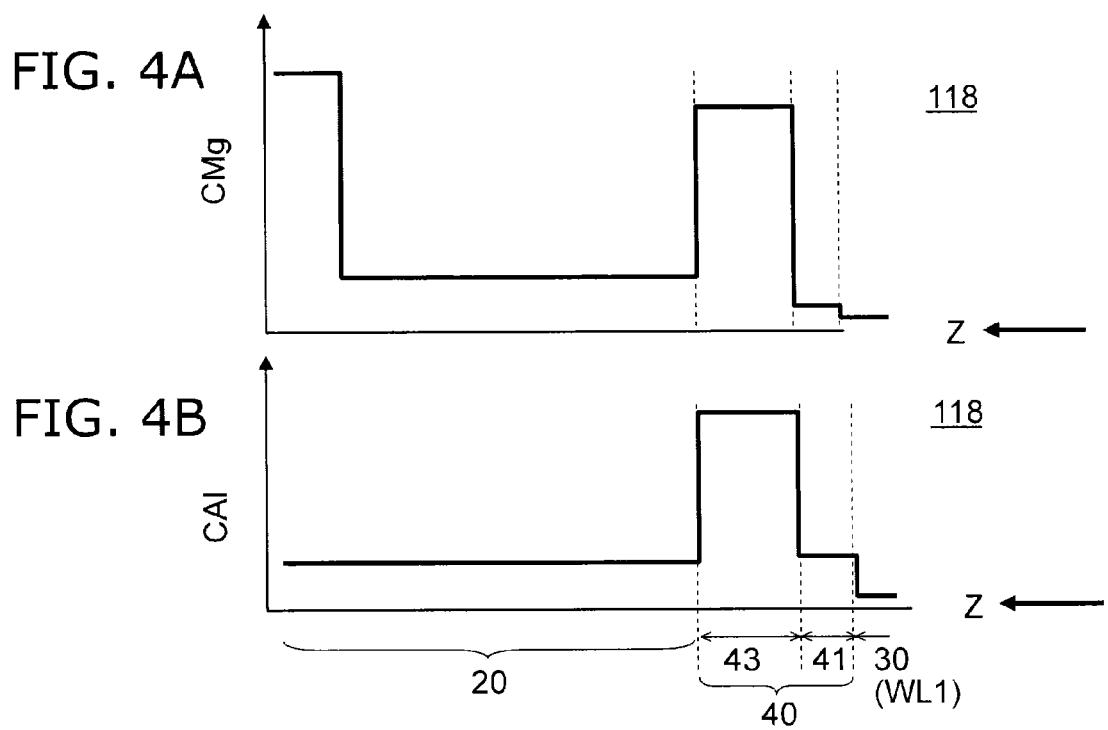

SEMICONDUCTOR LIGHT EMITTING ELEMENT AND METHOD FOR MANUFACTURING SEMICONDUCTOR LIGHT EMITTING ELEMENT

CROSS-REFERENCE TO RELATED APPLICATIONS

This application is based upon and claims the benefit of priority from Japanese Patent Application No. 2013-197489, filed on Sep. 24, 2013; the entire contents of which are incorporated herein by reference.

FIELD

Embodiments described herein relate generally to a semiconductor light emitting element and a method for manufacturing the semiconductor light emitting element.

BACKGROUND

Semiconductor light emitting elements (e.g., LEDs (Light Emitting Diodes), etc.) that use nitride semiconductors are being developed. It is necessary to increase the efficiency of such semiconductor light emitting elements.

BRIEF DESCRIPTION OF THE DRAWINGS

FIG. 4A and FIG. 4B are schematic views showing the semiconductor light emitting element of the reference example;

DETAILED DESCRIPTION

Figure 1A:
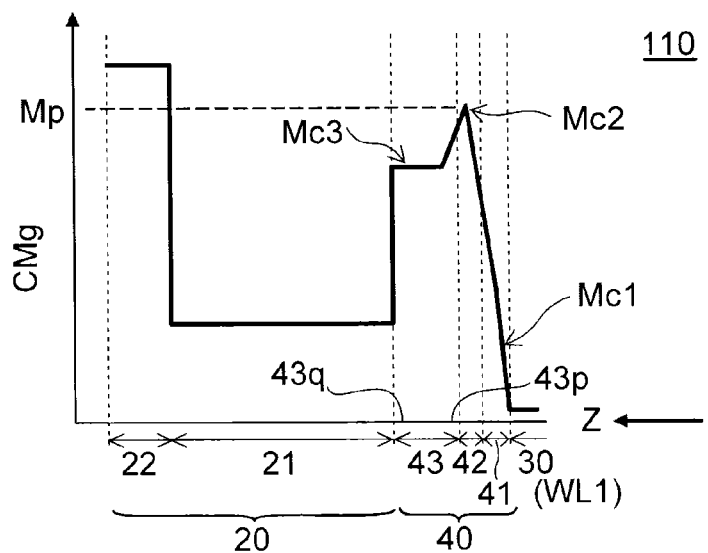
FIG. 1A to FIG. 1C are schematic views showing a semiconductor light emitting element according to a first embodiment.

According to one embodiment, a semiconductor light emitting element includes an n-type semiconductor layer including a nitride semiconductor, a p-type semiconductor layer including a nitride semiconductor, a light emitting unit, a first layer, a second layer, and a third layer. The light emitting unit is provided between the n-type semiconductor layer and the p-type semiconductor layer, and includes a first well layer including a nitride semiconductor. The first layer is provided between the first well layer and the p-type semiconductor layer, and includes $Al_{x1}Ga_{1-x1-y1}In_{y1}N$ ($0<x1<1$, $0\le y1<1$, and $x1+y1\le 1$) having a first Mg concentration. The second layer is provided between the first layer and the p-type semiconductor layer, and includes $Al_{x2}Ga_{1-x2-y2}In_{y2}N$ ($0\le x2<x1$, $0\le y2<1$, and $x2+y2\le 1$) and Mg. The second layer has a second Mg concentration higher than the first Mg concentration. The third layer is provided between the second layer and the p-type semiconductor layer, and includes $Al_{x3}Ga_{1-x3-y3}In_{y3}N$ ($x1<x3<1$, $0\le y3<1$, and $x3+y3\le 1$) and Mg. The third layer has a third Mg concentration higher than the first Mg concentration and lower than the second Mg concentration.

According to one embodiment, a semiconductor light emitting element includes an n-type semiconductor layer including a nitride semiconductor, a p-type semiconductor layer including a nitride semiconductor, a light emitting unit, a first layer, a second layer, and a third layer. The light emitting unit is provided between the n-type semiconductor layer and the p-type semiconductor layer, and includes a first well layer including a nitride semiconductor. The first layer is provided between the first well layer and the p-type semiconductor layer, and includes $Al_{x1}Ga_{1-x1-y1}In_{y1}N$ ($0\le x1<1$, $0\le y1<1$, and $x1+y1\le 1$) having a first Mg concentration. The second layer is provided between the first layer and the p-type semiconductor layer, and includes $Al_{x2}Ga_{1-x2-y2}In_{y2}N$ ($0\le x2\le x1$, $y1<y2<1$, and $x2+y2\le 1$) and Mg. The second layer has a second Mg concentration higher than the first Mg concentration. The third layer is provided between the second layer and the p-type semiconductor layer, and includes $Al_{x3}Ga_{1-x3-y3}In_{y3}N$ ($x1<x3<1$, $0<y3<1$, and $x3+y3\le 1$) and Mg. The third layer has a third Mg concentration higher than the first Mg concentration and lower than the second Mg concentration.

According to one embodiment, a method for manufacturing a semiconductor light emitting element is disclosed. The method can include forming a light emitting unit on an n-type semiconductor layer including a nitride semiconductor. The light emitting unit includes a first well layer including a nitride semiconductor. The method can include forming a first layer on the light emitting unit. The first layer includes $Al_{x1}Ga_{1-x1-y1}In_{y1}N$ ($0<x1<1$, $0\le y1<1$, and $x1+y1\le 1$) having a first Mg concentration. The method can include forming a second layer on the first layer. The second layer includes $Al_{x2}Ga_{1-x2-y2}In_{y2}N$ ($0\le x2<x1$, $0\le y2<1$, and $x2+y2\le 1$) and Mg. The second layer has a second Mg concentration higher than the first Mg concentration. In addition, the method can include forming a third layer on the second layer at a temperature higher than a formation temperature of the second layer. The third layer includes $Al_{x3}Ga_{1-x3-y3}In_{y3}N$ ($x1<x3<1$, $0 \leq y3<1$, and $x3+y3 \leq 1$) and Mg. The third layer has a third Mg concentration higher than the first Mg concentration and lower than the second Mg concentration.

According to one embodiment, a method for manufacturing a semiconductor light emitting element is disclosed. The method can include forming a light emitting unit on an n-type semiconductor layer including a nitride semiconductor. The light emitting unit includes a first well layer including a nitride semiconductor. The method can include forming a first layer on the light emitting unit. The first layer includes $Al_{x1}Ga_{1-x1-y1}In_{y1}N$ ($0 \leq x1<1$, $0 \leq y1<1$, and $x1+y1 \leq 1$) having a first Mg concentration. The method can include forming a second layer on the first layer. The second layer includes $Al_{x2}Ga_{1-x2-y2}In_{y2}N$ ($0 \leq x2<x1$, $y1<y2<1$, and $x2+y2 \leq 1$) and Mg. The second layer has a second Mg concentration higher than the first Mg concentration. In addition, the method can include forming a third layer on the second layer at a temperature higher than a formation temperature of the second layer. The third layer includes $Al_{x3}Ga_{1-x3-y3}In_{y3}N$ ($x1<x3<1$, $0<y3<1$, and $x3+y3 \leq 1$) and Mg. The third layer has a third Mg concentration higher than the first Mg concentration and lower than the second Mg concentration.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
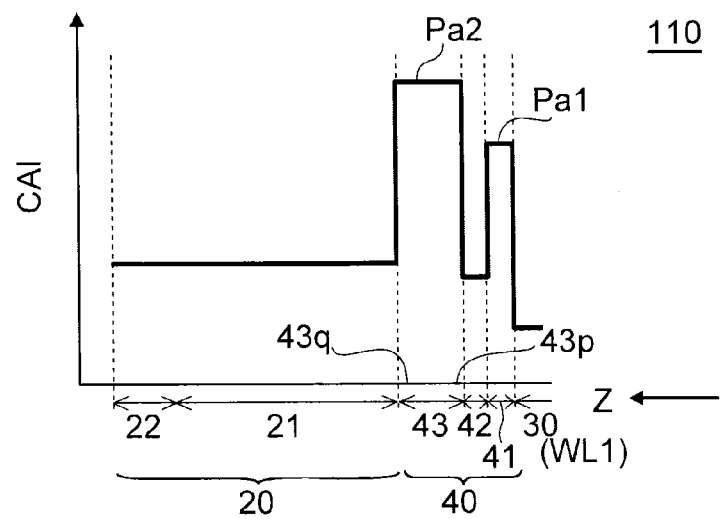
Figure 1C:
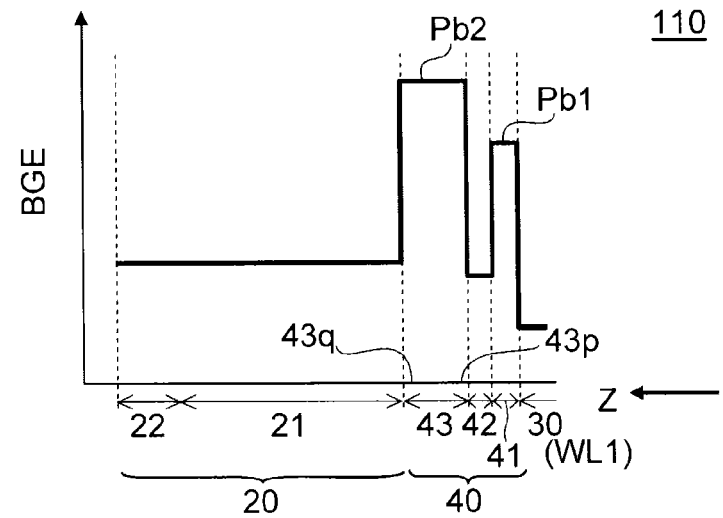

FIG. 1A to FIG. 1C are schematic views illustrating a semiconductor light emitting element according to a first embodiment.

Figure 2:
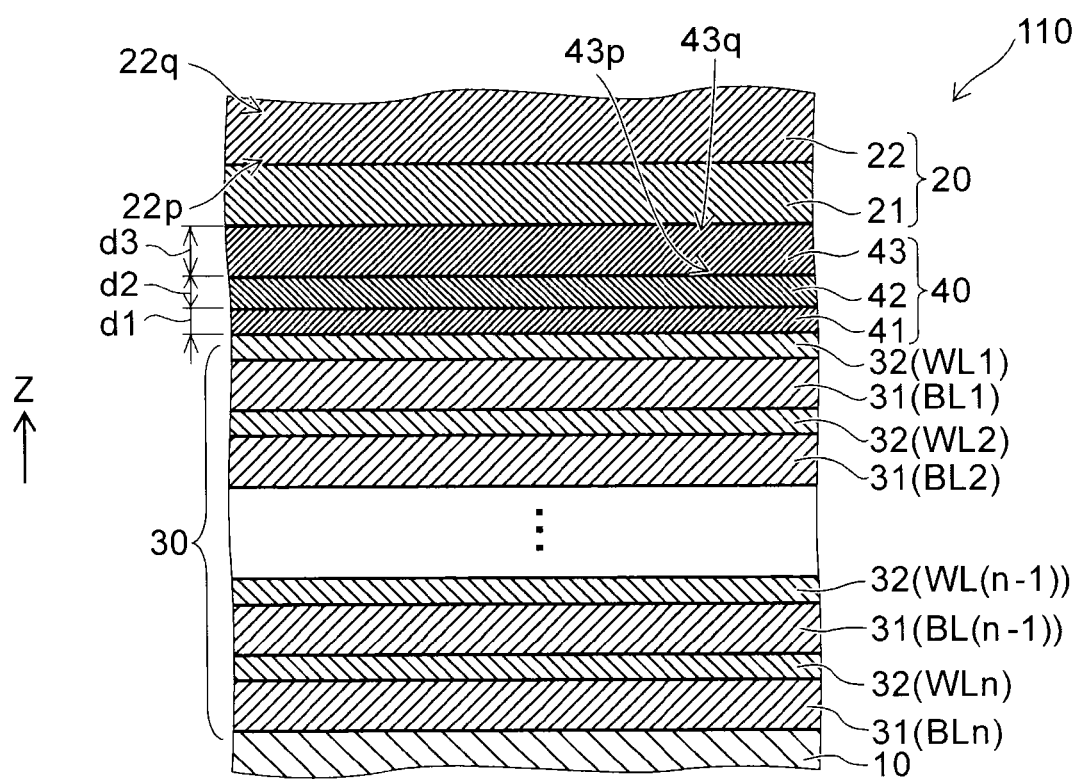
FIG. 2 is a schematic cross-sectional view showing the semiconductor light emitting element according to the first embodiment.

FIG. 2 is a schematic cross-sectional view illustrating the semiconductor light emitting element according to the first embodiment.

First, an overview of the configuration of the semiconductor light emitting element will be described with reference to FIG. 2.

As shown in FIG. 2, the semiconductor light emitting element 110 includes an n-type semiconductor layer 10, a p-type semiconductor layer 20, a light emitting unit 30, and a stacked unit 40.

The n-type semiconductor layer 10 includes a nitride semiconductor. The n-type semiconductor layer 10 includes, for example, silicon (Si) as, for example, an n-type impurity. The n-type semiconductor layer 10 includes, for example, a Si-doped n-type GaN layer.

The p-type semiconductor layer 20 includes a nitride semiconductor. The p-type semiconductor layer 20 includes, for example, magnesium (Mg) as, for example, a p-type impurity. For example, the p-type semiconductor layer 20 includes a first p-side layer 21 and a second p-side layer 22. For example, the first p-side layer 21 is provided between the n-type semiconductor layer 10 and the second p-side layer 22.

The first p-side layer 21 includes, for example, a Mg-doped p-type GaN layer.

The second p-side layer 22 includes, for example, a Mg-doped p-type GaN layer. The second p-side layer 22 includes, for example, a p-type contact layer. The characteristics (e.g., the Mg concentration) of the second p-side layer 22 may change in the thickness direction. For example, the second p-side layer 22 includes a light emitting unit-side portion 22p and a contact-side portion 22q. The light emitting unit-side portion 22p is provided between the contact-side portion 22q and the first p-side layer 21. For example, the Mg concentration of the contact-side portion 22q may change inside the contact-side portion 22q. For example, the Mg concentration of the contact-side portion 22q is higher than the Mg concentration of the light emitting unit-side portion 22p.

The direction from the n-type semiconductor layer 10 toward the p-type semiconductor layer 20 is taken as the stacking direction (a Z-axis direction). In the specification of the application, the state of being stacked includes not only the state of overlapping in contact with each other but also the state of overlapping with another layer inserted therebetween.

The light emitting unit 30 is provided between the n-type semiconductor layer 10 and the p-type semiconductor layer 20. The light emitting unit 30 includes, for example, a well layer 32 (a first well layer WL1). The well layer 32 (the first well layer WL1) includes a nitride semiconductor. In the example, the light emitting unit 30 further includes, for example, a barrier layer 31 (e.g., a first barrier layer BL1). The first barrier layer BL1 (the barrier layer 31) is disposed between the first well layer WL1 and the n-type semiconductor layer 10.

In the example shown in FIG. 2, the light emitting unit 30 has a multiple quantum well (MQW) configuration. The light emitting unit 30 includes, for example, n barrier layers 31 and n well layers 32 (n being an integer not less than 2). The multiple barrier layers 31 and the multiple well layers 32 are disposed alternately along the Z-axis. For example, n−1 barrier layers 31 and n well layers 32 may be provided in the light emitting unit 30.

The nth barrier layer BLn is disposed between the (n−1)th barrier layer BL(n−1) and the n-type semiconductor layer 10. The nth well layer WLn is disposed between the (n−1)th well layer WL(n−1) and the n-type semiconductor layer 10. For example, the nth well layer WLn is provided between the (n−1)th barrier layer BL(n−1) and the nth barrier layer BLn.

The light emitting unit 30 may have, for example, a single quantum well (SQW) configuration. In such a case, the light emitting unit 30 includes one barrier layer 31 and one well layer 32 (the first well layer WL1). The barrier layer 31 (e.g., the first barrier layer BL1) is disposed between the first well layer WL1 and the n-type semiconductor layer 10. For example, the light emitting unit 30 may include one well layer 32 and may not include the barrier layer 31.

In the example, the first well layer WL1 is the layer of the light emitting unit 30 most proximal to the p-type semiconductor layer 20. In the case where the barrier layer 31 is provided between the first well layer WL1 and the p-type semiconductor layer 20, the barrier layer 31 is taken to be a portion of the stacked unit 40 (e.g., at least a portion of a first layer 41 described below).

For example, violet light, blue light, green light, yellow light, or red light is emitted from the light emitting unit 30. The wavelength (the peak wavelength) of the light emitted from the light emitting unit 30 is, for example, not less than 400 nm but less than 800 nm. The well layer 32 (the first well layer WL1) includes, for example, $Al_{wa1}Ga_{1-wa1-wi1}In_{wi1}N$ ($0 \leq wa1 \leq 1$, $0 \leq wi1 \leq 1$, and $wa1+wi1 \leq 1$). The barrier layer 31 includes, for example, $Al_{ba1}Ga_{1-ba1-bi1}In_{bi1}N$ ($0 \leq ba1 \leq 1$, $0 \leq bi1 \leq 1$, and $ba1+bi1 \leq 1$). The bandgap energy of the barrier layer 31 is larger than the bandgap energy of the well layer 32. For example, the well layer 32 includes In. In the case where the barrier layer 31 includes In, the In composition ratio of the barrier layer 31 is lower than the In composition ratio of the well layer 32. Or, for example, the barrier layer 31 substantially does not include In.

For example, in the case of a light emission of violet light or blue light, the In composition ratio wi1 of the well layer 32 is not less than 0.05 and not more than 0.2, e.g., 0.18. In the case of blue light, for example, a GaInN layer is used as the well layer 32 (the first well layer WL1). For example, the first well layer WL1 substantially does not include Al.

The barrier layer 31 includes, for example, GaN, AlGaN, or AlGaInN. In the case where the barrier layer 31 includes AlGaN, for example, the flatness of the barrier layer 31 can be improved. In the case where the barrier layer 31 includes AlGaInN, for example, the flatness of the barrier layer 31 improves even in a low temperature growth process.

The stacked unit 40 is provided between the light emitting unit 30 and the p-type semiconductor layer 20. The stacked unit 40 includes, for example, the first layer 41, a second layer 42, and a third layer 43.

The first layer 41 is provided between the first well layer WL1 and the p-type semiconductor layer 20. In the example, the first layer 41 contacts the first well layer WL1. For example, an $Al_{x1}Ga_{1-x1-y1}In_{y1}N$ ($0<x1<1$, $0 \leq y1<1$, and $x1+y1 \leq 1$) layer is used as the first layer 41. The first layer 41 has a first bandgap energy. The first bandgap energy is larger than the bandgap energy of the first well layer WL1. The first layer 41 has, for example, a first Mg concentration. The first Mg concentration may be less than the detection limit; and there are cases where the first Mg concentration is, for example, substantially zero.

The second layer 42 is provided between the first layer 41 and the p-type semiconductor layer 20. For example, an $Al_{x2}Ga_{1-x2-y2}In_{y2}N$ ($0 \leq x2<x1$, $0 \leq y2<1$, and $x2+y2 \leq 1$) layer is used as the second layer 42. The second layer 42 has a second bandgap energy. The second bandgap energy is larger than the bandgap energy of the well layer 32 (the first well layer WL1) and smaller than the first bandgap energy. The second layer 42 has, for example, a second Mg concentration. The second Mg concentration is, for example, higher than the first Mg concentration.

The third layer 43 is provided between the second layer 42 and the p-type semiconductor layer 20. For example, an $Al_{x3}Ga_{1-x3-y3}In_{y3}N$ ($x1<x3<1$, $0 \leq y3<1$, and $x3+y3 \leq 1$) layer is used as the third layer 43. The third layer 43 has a third bandgap energy. The third bandgap energy is larger than the first bandgap energy. The third layer 43 has a third Mg concentration. The third Mg concentration is, for example, higher than the first Mg concentration and lower than the second Mg concentration.

For example, the Mg concentration may change along the Z-axis direction inside the third layer 43. For example, the third layer 43 includes a first portion 43p and a second portion 43q. The first portion 43p is provided between the second portion 43q and the second layer 42. The Mg concentration may be different between the first portion 43p and the second portion 43q. For example, the Mg concentration of the first portion 43p is higher than the Mg concentration of the second portion 43q.

The first layer 41 has a first thickness d1. The second layer 42 has a second thickness d2. The third layer 43 has a third thickness d3. For example, the first thickness d1 is thinner than the third thickness d3; and the second thickness d2 is thinner than the third thickness d3. The first thickness d1 is thicker than the second thickness d2. The third thickness d3 is, for example, thinner than the thickness of the p-type semiconductor layer 20.

For example, the first well layer WL1 includes In. In such a case, the In composition ratio y1, the In composition ratio y2, and the In composition ratio y3 are lower than the In composition ratio of the first well layer WL1.

FIG. 1A, FIG. 1B, and FIG. 1C schematically illustrate the profile of the Mg concentration, the profile of the Al composition ratio, and the profile of the bandgap energy for the semiconductor light emitting element 110 according to the embodiment, respectively.

In these figures, the horizontal axis is the Z-axis direction position. In FIG. 1A, the vertical axis is a Mg concentration CMg. In FIG. 1B, the vertical axis is an Al composition ratio CAl. In FIG. 1C, the vertical axis is a bandgap energy BGE. In the example, the bandgap energy BGE is the energy relating to the electrons.

As shown in FIG. 1A, the Mg concentration (a second Mg concentration Mc2) of the second layer 42 is higher than the Mg concentration (a first Mg concentration Mc1) of the first layer 41. The second Mg concentration Mc2 is higher than the Mg concentration (a third Mg concentration Mc3) of the third layer 43. For example, the position of a peak Mp of the Mg concentration of the stacked unit 40 (the first layer 41, the second layer 42, and the third layer 43) corresponds to the position of the second layer 42.

For example, the Mg concentration of the third layer 43 decreases from the portion (the first portion 43p) of the third layer 43 on the light emitting unit 30 side toward the portion (the second portion 43q) of the third layer 43 on the p-type semiconductor layer 20 side. In the example, the change of the Mg concentration of the second portion 43q is smaller than the change of the Mg concentration of the first portion 43p.

As shown in FIG. 1B, the Al composition ratio increases from the light emitting unit 30 (the first well layer WL1) toward the first layer 41; and a first peak (a first Al peak Pa1) is formed. The Al composition ratio decreases from the first layer 41 toward the second layer 42. The Al composition ratio increases from the second layer 42 toward the third layer 43; and a second peak (a second Al peak Pa2) is formed. The height of the second Al peak Pa2 is higher than the height of the first Al peak Pa1. The Al composition ratio decreases from the third layer 43 toward the p-type semiconductor layer 20. For example, the Al composition ratio of the p-type semiconductor layer 20 is lower than the Al composition ratio of the third layer 43. In the example, the third layer 43 substantially does not include In. The In composition ratio y3 is, for example, substantially 0.

In the stacked unit 40, the profile of the Al composition ratio has two peaks (e.g., the first Al peak Pa1 and the second Al peak Pa2). The position of the first Al peak Pa1 corresponds to the position of the first layer 41. The position of the second Al peak Pa2 corresponds to the position of the third layer 43.

As shown in FIG. 1C, the bandgap energy increases from the first well layer WL1 toward the first layer 41 as the Al composition ratio changes. The bandgap energy becomes large at the positions corresponding to the first Al peak Pa1 and the second Al peak Pa2 of the Al composition ratio. The bandgap energy of the second layer 42 is larger than the bandgap energy of the light emitting unit 30 (the first well layer WL1) and smaller than the bandgap energy of the first layer 41.

For example, the Mg concentration is high between the position of the first Al peak Pa1 and the position of the second Al peak Pa2. At this position, the Mg concentration has a peak Mp. In other words, in the second layer 42 that has a small bandgap energy, the Mg concentration is high and has the peak Mp.

Thus, in the semiconductor light emitting element 110, the Mg concentration is high in the second layer 42 that has a larger bandgap energy than the first well layer WL1 and a smaller bandgap energy than the first layer 41. The luminous efficiency can be increased; and a high efficiency is obtained.

An example of evaluation results of the characteristics of the semiconductor light emitting element according to the embodiment will now be described.

First, the configuration and construction conditions of the semiconductor light emitting element that is evaluated will be described.

Figure 3A:
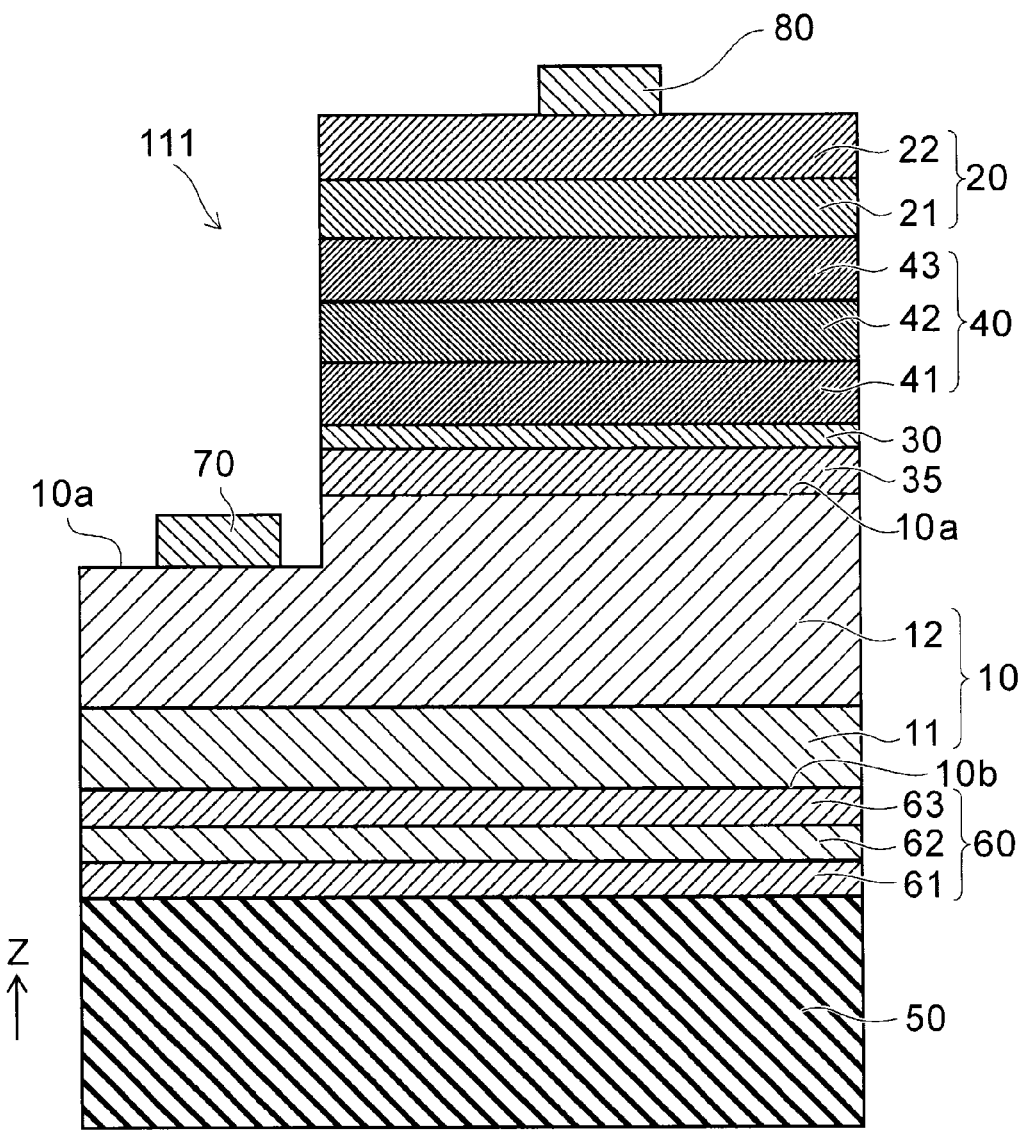
FIG. 3A and FIG. 3B are schematic cross-sectional views showing the semiconductor light emitting element according to the first embodiment.
Figure 3B:
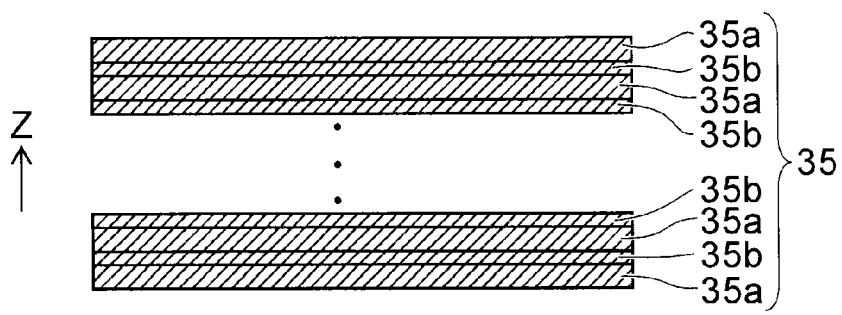

FIG. 3A and FIG. 3B are schematic cross-sectional views illustrating the semiconductor light emitting element according to the first embodiment.

FIG. 3A is a schematic cross-sectional view illustrating the semiconductor light emitting element 111 used in the evaluation. FIG. 3B is a schematic cross-sectional view illustrating a portion of the semiconductor light emitting element 111.

As shown in FIG. 3A, the n-type semiconductor layer 10, the p-type semiconductor layer 20, the light emitting unit 30, and the stacked unit 40 are provided in the semiconductor light emitting element 111. Further, a substrate 50, a buffer unit 60, a first electrode 70, a second electrode 80, and a multilayered structural body 35 are provided. In the example, a first n-side layer 11 and a second n-side layer 12 are used as the n-type semiconductor layer 10.

A sapphire substrate is used as the substrate 50. The major surface of the sapphire substrate is, for example, the c-plane. The substrate 50 may include, for example, a Si substrate or a GaN substrate. The major surface of the Si substrate is, for example, the (111) plane. The substrate 50 may include, for example, AlN, gallium oxide, or diamond. The substrate 50 is appropriately selected according to, for example, the layer (e.g., the light emitting unit 30) to be grown on the substrate 50.

The buffer unit 60 is provided between the substrate 50 and the n-type semiconductor layer 10. In the example, a first buffer layer 61, a second buffer layer 62, and a third buffer layer 63 are provided in the buffer unit 60.

The first buffer layer 61 is provided between the substrate 50 and the n-type semiconductor layer 10. The second buffer layer 62 is provided between the first buffer layer 61 and the n-type semiconductor layer. The third buffer layer 63 is provided between the second buffer layer 62 and the n-type semiconductor layer 10.

The first n-side layer 11 is provided between the light emitting unit 30 and the buffer unit 60. In the example, the first n-side layer 11 includes a Si-doped n-type GaN layer. The second n-side layer 12 is provided between the light emitting unit 30 and the first n-side layer 11. In the example, the second n-side layer 12 includes a Si-doped n-type GaN layer. The second n-side layer 12 includes a contact layer. The Si concentration of the second n-side layer 12 is higher than the Si concentration of the first n-side layer 11.

In the example, the multilayered structural body 35 is provided between the n-type semiconductor layer 10 and the light emitting unit 30. The multilayered structural body 35 includes multiple layers that have mutually-different compositions and are stacked alternately in the Z-axis direction. The multilayered structural body 35 is, for example, a superlattice layer.

As shown in FIG. 3B, the multilayered structural body 35 includes, for example, multiple first superlattice films 35a and multiple second superlattice films 35b. For example, the second superlattice films 35b are provided respectively in the spaces between the first superlattice films 35a. The first superlattice film 35a and the second superlattice film 35b include nitride semiconductors. The first superlattice film 35a includes, for example, GaN. The second superlattice film 35b includes, for example, InGaN. The thickness of the first superlattice film 35a is, for example, not less than 1 nm and not more than 5 nm, e.g., 3 nm. The thickness of the second superlattice film 35b is, for example, not less than 0.5 nm and not more than 5 nm, e.g., 1 nm.

The light emitting unit 30 is disposed between the multilayered structural body 35 and the p-type semiconductor layer 20. The stacked unit 40 is disposed between the light emitting unit 30 and the p-type semiconductor layer 20. The number of well layers 32 in the semiconductor light emitting element 111 is 1. In other words, a SQW structure is applied to the light emitting unit 30 of the semiconductor light emitting element 111.

The first electrode 70 is provided, for example, on a portion of the n-type semiconductor layer 10. The n-type semiconductor layer 10 has, for example, a first major surface 10a and a second major surface 10b. The first major surface 10a is the surface on the light emitting unit 30 side. The second major surface 10b is the surface on the side opposite to the first major surface 10a. For example, a portion of the n-type semiconductor layer 10 is exposed on the first major surface 10a side. The first electrode 70 is provided on the exposed portion of the n-type semiconductor layer 10.

In the specification of the application, the state of being "provided on" includes not only the state of being provided in direct contact but also the state of having another layer inserted therebetween.

The first electrode 70 includes, for example, a stacked film of Al and Au. A stacked film of a Ti film/Ni film/Au film may be used. The first electrode 70 may include a silver alloy. A high optical reflectance is obtained. The first electrode 70 may include, for example, a silver alloy including about 1% palladium (Pd). The first electrode 70 is electrically connected to the n-type semiconductor layer 10.

The second electrode 80 is provided on the p-type semiconductor layer 20. The second electrode 80 includes, for example, at least one selected from a Ni film, an Al film, and a film including Ag. The second electrode 80 is electrically connected to the p-type semiconductor layer 20.

A voltage is applied between the first electrode 70 and the second electrode 80. A current is supplied to the light emitting unit 30 via the n-type semiconductor layer 10 and the p-type semiconductor layer 20; and light is emitted from the light emitting unit 30.

An example of a method for manufacturing the semiconductor light emitting element 111 will now be described. In the following manufacturing method, the formation of the semiconductor layer includes, for example, MOCVD.

For example, the buffer unit 60 is formed on the substrate 50. The substrate 50 includes, for example, a c-plane sapphire substrate. For example, an AlN layer is formed as the first buffer layer 61 on the substrate 50. The first buffer layer 61 has a first carbon concentration. The first carbon concentration is, for example, not less than $3 \times 10^{18}$ cm$^{-3}$ and not more than $5 \times 10^{20}$ cm$^{-3}$. The thickness of the first buffer layer 61 is, for example, not less than 3 nm and not more than 20 nm.

For example, an AlN layer is formed as the second buffer layer 62 on the first buffer layer 61. The second buffer layer 62 has, for example, a second carbon concentration. The first carbon concentration is higher than the second carbon concentration. The second carbon concentration is, for example, not less than $1\times10^{16}$ cm$^{-3}$ but less than $3\times10^{18}$ cm$^{-3}$. The thickness of the second buffer layer 62 is, for example, thicker than the thickness of the first buffer layer 61. The thickness of the second buffer layer 62 is, for example, 2 µm.

A non-doped GaN layer is formed as the third buffer layer 63 on the second buffer layer 62. The thickness of the third buffer layer 63 is, for example, 2 µm. The third buffer layer 63 is, for example, a lattice relaxation layer.

For example, the n-type semiconductor layer 10 is formed on the third buffer layer 63. In the example, the first n-side layer 11 and the second n-side layer 12 are formed. A Si-doped n-type GaN layer that is used to form the first n-side layer 11 is formed on the third buffer layer 63. At this time, the formation temperature is, for example, not less than 950° C. and not more than 1200° C. The Si concentration of the Si-doped n-type GaN layer is, for example, not less than $2\times10^{17}$ cm$^{-3}$ and not more than $2\times10^{19}$ cm$^{-3}$. In the example, the Si concentration of the Si-doped n-type GaN layer is not less than $0.2\times10^{19}$ cm$^{-3}$ and not more than $2\times10^{19}$ cm$^{-3}$. The thickness of the first n-side layer 11 is, for example, not less than 0.1 µm and not more than 6 µm. In the example, the thickness of the first n-side layer 11 is 6 µm.

A Si-doped n-type GaN layer that is used to form the second n-side layer 12 is formed on the first n-side layer 11. At this time, the formation temperature is, for example, not less than 950° C. and not more than 1200° C. The Si concentration of the Si-doped n-type GaN layer is, for example, not less than $1\times10^{17}$ cm$^{-3}$ and not more than $1\times10^{19}$ cm$^{-3}$. In the example, the Si concentration is not less than $0.2\times10^{18}$ cm$^{-3}$ and not more than $9\times10^{18}$ cm$^{-3}$. The thickness of the second n-side layer 12 is, for example, not less than 0.05 µm and not more than 1 µm. In the case where the first electrode 70 includes a silver alloy, it is favorable for the Si concentration of the second n-side layer 12 to be high. In such a case, the Si concentration of the second n-side layer 12 is, for example, not less than $0.6\times10^{19}$ cm$^{-3}$ and not more than $3\times10^{19}$ cm$^{-3}$.

The barrier layer 31 is formed on the second n-side layer 12; and the well layer 32 is formed on the barrier layer 31. In the example, AlGaInN is formed as the barrier layer 31. At this time, the formation temperature is, for example, not less than 750° C. and not more than 1050° C. The Si concentration of the barrier layer 31 is, for example, not more than $2\times10^{19}$ cm$^{-3}$. The thickness of the barrier layer 31 is, for example, not less than 2 nm and not more than 25 nm. For example, GaInN is formed as the well layer 32. At this time, the formation temperature is, for example, not less than 750° C. and not more than 900° C. The thickness of the well layer 32 is, for example, not less than 1 nm and not more than 20 nm. In the example, a $Ga_{0.93}In_{0.07}N$ layer is formed as the well layer 32 (the first well layer WL1). The thickness of the first well layer WL1 is 6 nm. A Si-doped n-type $Al_{0.065}Ga_{0.93}In_{0.005}N$ layer is used as the barrier layer 31. The Si concentration of the barrier layer 31 is, for example, not less than $0.5\times10^{19}$ cm$^{-3}$ and not more than $2\times10^{19}$ cm$^{-3}$. The thickness of the barrier layer 31 is 13.5 nm. The wavelength of the light emitted from the light emitting unit 30 is not less than 360 nm and not more than 400 nm. In other words, near-ultraviolet light is emitted.

The stacked unit 40 is formed on the light emitting unit 30. In other words, in the example, an AlGaInN layer is formed as the first layer 41 on the first well layer WL1. At this time, the formation temperature is, for example, not less than 800° C. and not more than 1100° C. The Mg concentration of the first layer 41 is, for example, not less than $1\times10^{17}$ cm$^{-3}$ and not more than $1\times10^{18}$ cm$^{-3}$. The thickness of the first layer 41 is, for example, not less than 2 nm and not more than 10 nm.

A GaN layer is formed as the second layer 42 on the first layer 41. The formation temperature of the second layer 42 is, for example, not less than 800° C. and not more than 1100° C. The Mg concentration of the second layer 42 is, for example, not less than $1\times10^{18}$ cm$^{-3}$ and not more than $5\times10^{20}$ cm$^{-3}$. The thickness of the second layer 42 is, for example, not less than 2 nm and not more than 10 nm.

For example, an AlGaN layer is formed as the third layer 43 on the second layer 42. The formation temperature of the third layer 43 is, for example, not less than 800° C. and not more than 1100° C. The Mg concentration of the third layer 43 is, for example, not less than $3\times10^{18}$ cm$^{-3}$ and not more than $5\times10^{19}$ cm$^{-3}$. The thickness of the third layer 43 is, for example, not less than 5 nm and not more than 30 nm.

In the example, an $Al_{0.065}Ga_{0.93}In_{0.005}N$ layer is formed as the first layer 41. The first thickness d1 is 6 nm. In the example, a GaN layer is formed as the second layer 42. The second thickness d2 is 3 nm. In the example, a Mg-doped p-type $Al_{0.25}Ga_{0.75}N$ layer is formed as the third layer 43. The third thickness d3 is 24 nm. The Mg concentration of the first portion 43p of the third layer 43 is not less than $0.8\times10^{19}$ cm$^{-3}$ and not more than $5\times10^{19}$ cm$^{-3}$. The Mg concentration of the second portion 43q is not less than $0.2\times10^{19}$ cm$^{-3}$ and not more than $2\times10^{19}$ cm$^{-3}$.

The p-type semiconductor layer 20 is formed on the stacked unit 40. For example, the first p-side layer 21 and the second p-side layer 22 are formed. For example, a GaN layer is formed as the first p-side layer 21 on the third layer 43. At this time, the formation temperature is, for example, not less than 900° C. and not more than 1200° C. The Mg concentration of the first p-side layer 21 is, for example, not less than $1\times10^{17}$ cm$^{-3}$ and not more than $2\times10^{19}$ cm$^{-3}$. The thickness of the first p-side layer 21 is, for example, not less than 0 nm and not more than 300 nm. A GaN layer is formed as the second p-side layer 22 on the first p-side layer 21. At this time, the formation temperature is, for example, not less than 900° C. and not more than 1200° C. The thickness of the second p-side layer 22 is, for example, not less than 0 nm and not more than 300 nm.

In the example, a Mg-doped p-type GaN layer is formed as the first p-side layer 21. The Mg concentration of the first p-side layer 21 is not less than $2\times10^{18}$ cm$^{-3}$ and not more than $5\times10^{18}$ cm$^{-3}$. The thickness of the first p-side layer 21 is 80 nm. The first p-side layer 21 is thicker than the third layer 43. A Mg-doped p-type GaN layer is formed as the second p-side layer 22. The Mg concentration of the second p-side layer 22 is not less than $0.2\times10^{19}$ cm$^{-3}$ and not more than $20\times10^{20}$ cm$^{-3}$. In the example, the Mg concentration changes inside the second p-side layer 22. The Mg concentration of the light emitting unit-side portion 22p is, for example, not less than $0.2\times10^{19}$ cm$^{-3}$ and not more than $2\times10^{19}$ cm$^{-3}$. The Mg concentration of the contact-side portion 22q is, for example, not less than $5\times10^{19}$ cm$^{-3}$ and not more than $20\times10^{20}$ cm$^{-3}$.

Portions of the p-type semiconductor layer 20, the stacked unit 40, and the light emitting unit 30 are removed until the n-type semiconductor layer 10 is reached. The removal includes, for example, dry etching using a mask. Thereby, a portion of the n-type semiconductor layer 10 is exposed.

For example, a $SiO_2$ film (not shown) is formed on the entire patterning body. The formation of the $SiO_2$ film includes, for example, thermal CVD (Thermal Chemical Vapor Deposition). The thickness of the $SiO_2$ film is, for example, 400 nm.

A resist is formed on the $SiO_2$ film. For example, the resist is patterned for lift-off. A portion of the $SiO_2$ film formed on the p-type semiconductor layer 20 is removed. The removal includes, for example, ammonium fluoride processing. A second electrode film that is used to form the second electrode 80 is formed on the portion where the SiO$_2$ film is removed. The second electrode film is, for example, light-reflective and conductive. The second electrode film includes, for example, a Ag film. The formation of the second electrode film includes, for example, vacuum vapor deposition. The thickness of the second electrode film is, for example, 200 nm. For example, sintering may be performed after the formation of the second electrode film. The temperature of the sintering is, for example, 350° C. The atmosphere of the sintering is, for example, a nitrogen atmosphere. The time of the sintering is, for example, 1 minute. Thereby, the second electrode 80 is formed.

The first electrode 70 is formed as follows. Namely, the SiO$_2$ film that is formed on the exposed n-type semiconductor layer 10 is removed. The removal includes, for example, ammonium fluoride processing. A first electrode film that is used to form the first electrode 70 is formed on the portion where the SiO$_2$ film is removed. The first electrode film is conductive. The first electrode film includes, for example, a stacked film of a Ti film/Pt film/Au film. The thickness of the first electrode film is, for example, 500 nm.

For example, the back surface of the substrate 50 is polished. For example, the semiconductor layer is cut with the substrate 50 into a prescribed size. The cutting includes, for example, cleavage, a diamond blade, etc. Thereby, the semiconductor light emitting element 111 is formed. The length (the width of the semiconductor light emitting element 111) along a direction perpendicular to the stacking direction is, for example, 400 μm. The length (the thickness of the semiconductor light emitting element 111) along the stacking direction is, for example, 100 μm. As described below, the substrate 50 may be removed.

On the other hand, a semiconductor light emitting element of a reference example also is made.

FIG. 4A and FIG. 4B are schematic views illustrating the semiconductor light emitting element of the reference example.

FIG. 4A shows the profile of the Mg concentration of the semiconductor light emitting element 118 of the reference example. FIG. 4B shows the profile of the Al composition ratio of the semiconductor light emitting element 118.

As shown in FIG. 4A and FIG. 4B, the second layer 42 is not provided in the semiconductor light emitting element 118 of the reference example. In the third layer 43, the Mg concentration has a peak; and the Al composition ratio has a peak. Otherwise, the semiconductor light emitting element 118 is the same as the semiconductor light emitting element 111.

An example of evaluation results of the characteristics of the semiconductor light emitting element will now be described.

Figure 5A:
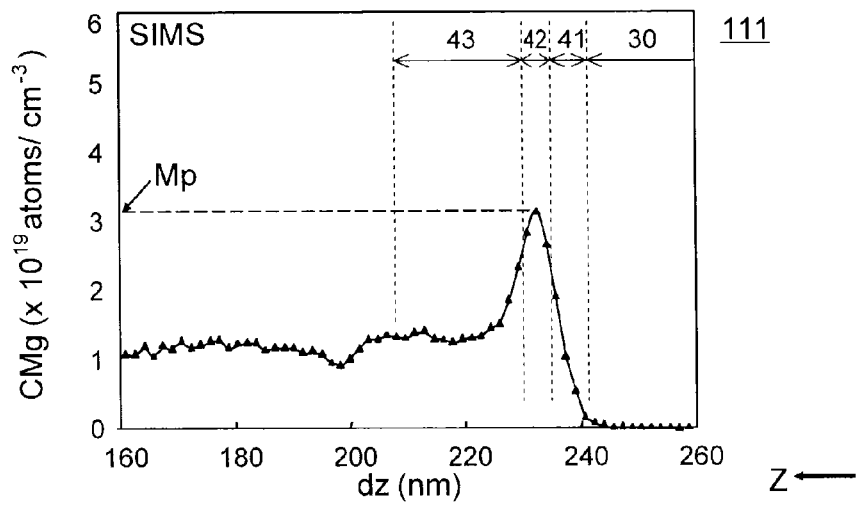
FIG. 5A to FIG. 5C are graphs showing characteristics of the semiconductor light emitting element according to the first embodiment.
Figure 5B:
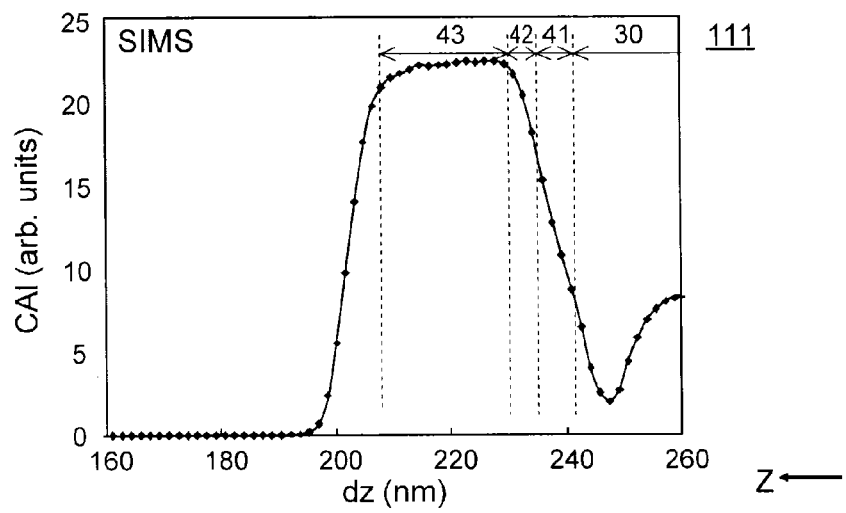
Figure 5C:
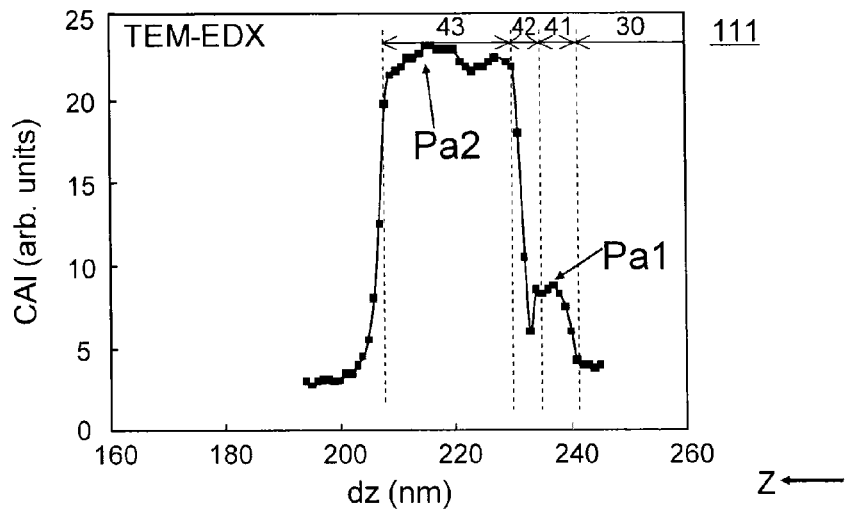

FIG. 5A to FIG. 5C are graphs illustrating characteristics of the semiconductor light emitting element according to the first embodiment.

FIG. 5A shows the results of the Mg concentration of the portion of the semiconductor light emitting element 111 including the stacked unit 40 when measured by SIMS (Secondary Ion Mass Spectrometry). FIG. 5B shows the results of the Al composition ratio of the portion of the semiconductor light emitting element 111 including the stacked unit 40 when measured by SIMS. FIG. 5C shows the results of the Al composition ratio of the portion of the semiconductor light emitting element 111 including the stacked unit 40 when measured by cross section TEM EDX (Transmission Electron Microscope Energy Dispersive X-ray Spectroscopy).

It can be seen from FIG. 5A that the peak of Mg corresponds to the position of the second layer 42. On the other hand, it can be seen from the results of the SIMS analysis in FIG. 5B that one peak of Al is observed in the stacked unit 40. Conversely, in the TEM EDX analysis as shown in FIG. 5C, two peaks of Al (the first Al peak Pa1 and the second Al peak Pa2) are observed in the stacked unit 40.

It can be seen from FIG. 5A and FIG. 5C that the peak Mp of the Mg concentration of the stacked unit 40 exists at a position between the two peaks.

Thus, two peaks that are not observed by SIMS are observed by TEM EDX. It is considered that the two peaks of Al are not observed by SIMS because the resolution of SIMS is low. Thus, there are cases where the relationship between the position of the peak of the Mg concentration and the peak position of the Al composition ratio is not obtained distinctly in analysis by SIMS.

On the other hand, in the case where the Mg concentration is low, it may be difficult to detect Mg by TEM EDX. It is favorable to use SIMS when detecting Mg having a low concentration.

Thus, it can be detected by a combination of SIMS and TEM EDX that in the semiconductor light emitting element 111, the Al composition ratio has two peaks, and a layer having a high Mg concentration exists at a position between the peaks.

Because the second layer 42 is not provided in the semiconductor light emitting element 118, one peak of the Mg concentration and one peak of the Al composition ratio appear at positions corresponding to the third layer 43 in the stacked unit 40.

Figure 6:
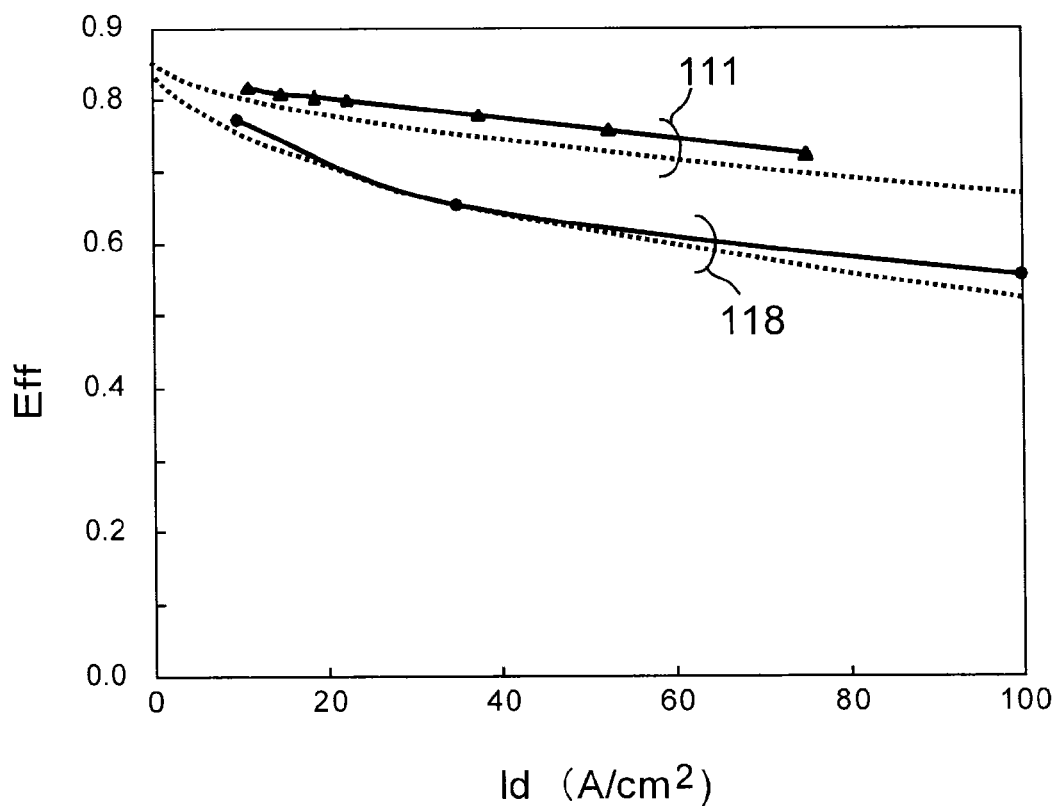
FIG. 6 is a graph showing characteristics of the semiconductor light emitting element.

FIG. 6 is a graph illustrating characteristics of the semiconductor light emitting element.

FIG. 6 shows the efficiencies of the semiconductor light emitting element 111 and the semiconductor light emitting element 118. The horizontal axis is a current density Id (A/cm$^2$). The vertical axis is a luminous efficiency Eff. In FIG. 6, the solid lines are measured values. The wavy lines are simulation values of the semiconductor light emitting elements. The measured value of the luminous efficiency Eff is the value obtained by using a light extraction efficiency of 0.8 to convert the measured value and corresponds to the internal quantum efficiency. The luminous efficiency Eff of the simulation corresponds to the internal quantum efficiency.

It can be seen from FIG. 6 that a higher luminous efficiency is obtained for the semiconductor light emitting element 111 according to the embodiment than for the semiconductor light emitting element 118 of the reference example.

Thus, in the embodiment as recited above, the luminous efficiency can be increased by employing the stacked unit 40 including the second layer 42.

According to experiments of the inventor of the application, it is considered that it is difficult for Mg to exist at a high concentration in a layer having a high Al composition ratio. In other words, when Mg is added at a high concentration to a layer having a high Al composition ratio, Mg easily diffuses into the other layers.

On the other hand, there is a tendency for the luminous efficiency to decrease when the Mg diffuses into the light emitting unit. In the embodiment, the first layer 41 is provided between the light emitting unit 30 (the first well layer WL1) and the second layer 42 having a high Mg concentration. The Al composition ratio of the first layer 41 is higher than the Al composition ratio of the second layer 42. Also, the Mg concentration of the first layer 41 is low. Therefore, the diffusion into the first well layer WL1 of the Mg from the second layer 42 having the high Mg concentration is suppressed by the first layer 41. Because the diffusion of the Mg into the first well layer WL1 is suppressed, a high luminous efficiency can be maintained.

On the other hand, the third layer 43 that has a high Al composition ratio is disposed between the second layer 42 and the p-type semiconductor layer 20. In other words, the second layer 42 that has the high Mg concentration is interposed between the third layer 43 and the first layer 41 having an Al composition ratio that is higher than that of the second layer 42. The diffusion of the Mg from the second layer 42 is suppressed reliably by the first layer 41 and the third layer 43. Therefore, the controllability of the Mg concentration of the second layer 42 is good. The desired Mg concentration of the second layer 42 is obtained with good reproducibility and good controllability.

In the semiconductor light emitting element 118 of the reference example, the Mg concentration also is high in the third layer 43 which has a high Al composition ratio. Therefore, the Mg diffuses toward the first well layer WL1; and as a result, the luminous efficiency decreases easily.

Thereby, it is considered that a higher luminous efficiency is obtained in the embodiment than in the reference example.

In the embodiment, the first layer 41 may include medium In composition (Al)Ga(In)N having a low Mg concentration (to which Mg may not be added); the second layer 42 may include high In composition (Al)GaInN having a high Mg concentration; and the third layer 43 may include low In composition AlGa(In)N having a medium Mg concentration. In such a case as well, the controllability of the Mg concentration of the second layer 42 is good. In the second layer 42, the desired Mg concentration is obtained with good reproducibility and good controllability.

Further, in the embodiment, dips in the bands (the valence band and the conduction band) at the periphery of the light emitting unit 30 are suppressed; and as a result, the efficiency of the recombination of the carriers increases; and the luminous efficiency can be increased. Simulation results of the band profile and the carrier density will now be described. The following are the simulation results of a model in which the light emitting unit 30 has a MQW structure. Other than the light emitting unit 30 having a MQW structure, the semiconductor light emitting element 111a of the model of the simulation is similar to the semiconductor light emitting element 111. The number of well layers 32 of the semiconductor light emitting element 111a is 8. Similarly, simulation results of characteristics of a semiconductor light emitting element 118a that corresponds to the semiconductor light emitting element 118 of the reference example having a MQW structure will now be described. The number of well layers of the semiconductor light emitting element 118a also is 8.

Figure 7A:
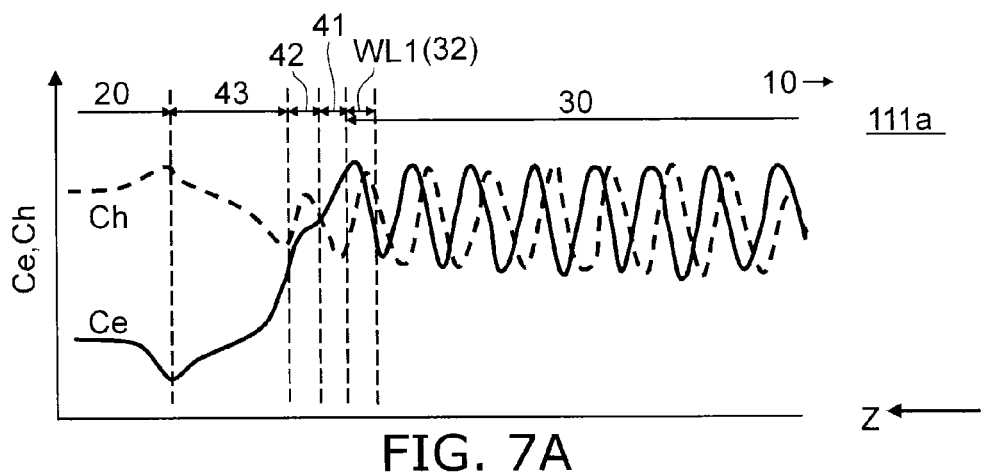
FIG. 7A and FIG. 7B are graphs showing characteristics of the semiconductor light emitting element according to the first embodiment.
Figure 7B:
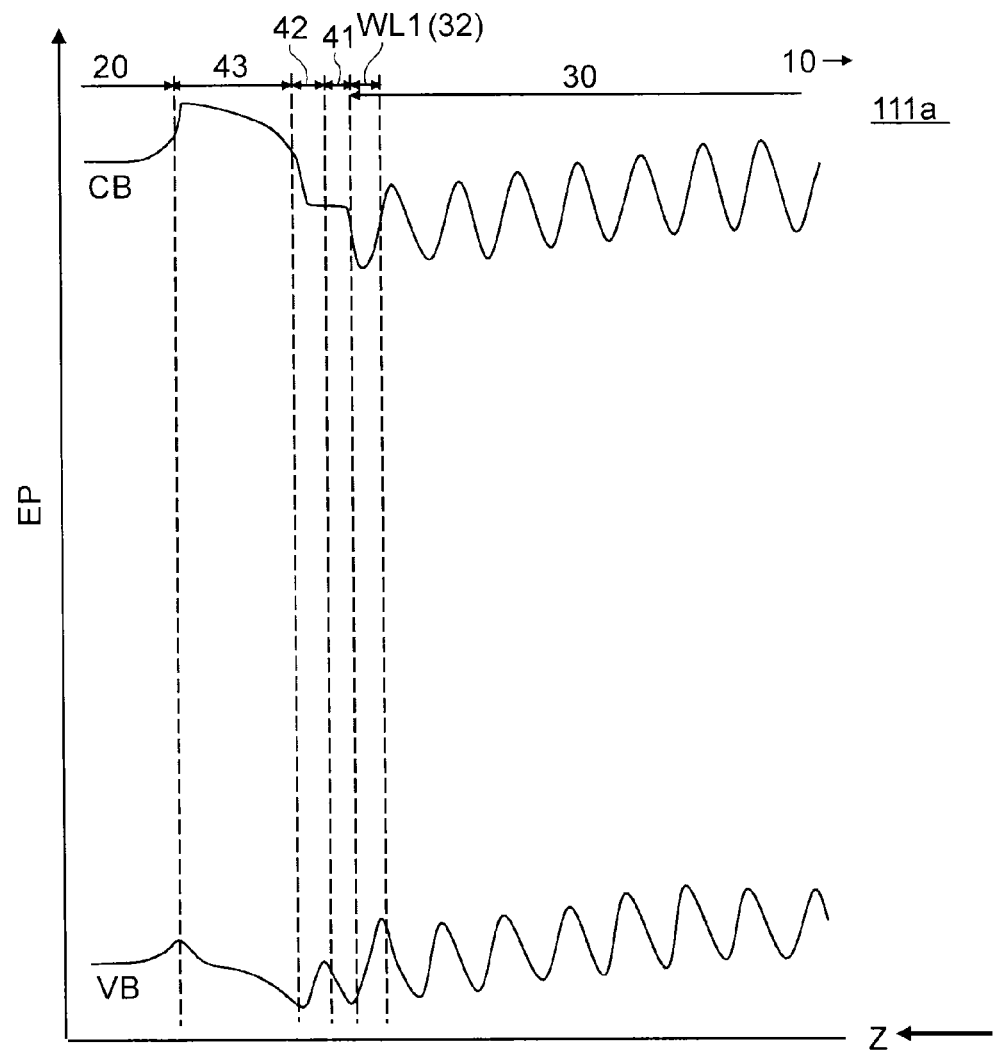

FIG. 7A and FIG. 7B are graphs illustrating characteristics of the semiconductor light emitting element according to the first embodiment.

These figures correspond to the semiconductor light emitting element 111a according to the embodiment. FIG. 7A illustrates an electron carrier density Ce and a hole carrier density Ch. FIG. 7B illustrates energy EP; and a valence band VB and a conduction band CB are shown. In these figures, the horizontal axis is the Z-axis direction position. The current is set to 350 mA in these simulations. In this case, the voltage is 3.115 V.

It can be seen from FIG. 7B that for the conduction band CB, the energy EP of the third layer 43 is sufficiently high compared to the energy EP of the first well layer WL1. In other words, a high barrier effect for the electrons is obtained in the third layer 43. In other words, the overflow of the electrons from the first well layer WL1 can be suppressed effectively. On the other hand, for the valence band VB, the energy EP is relatively high in the first layer 41 and the second layer 42. In other words, the first layer 41 and the second layer 42 substantially are not barriers for the holes. Therefore, the holes are efficiently injected toward the first well layer WL1.

It can be seen from FIG. 7A that the electron carrier density Ce is high and the hole carrier density Ch is high in the first well layer WL1. Therefore, a high luminous efficiency is obtained.

Figure 8A:
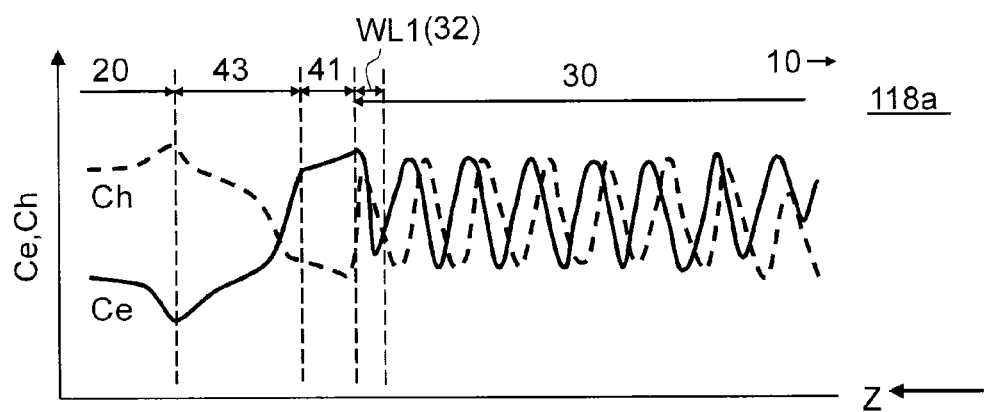
FIG. 8A and FIG. 8B are graphs showing characteristics of the semiconductor light emitting element of the reference example.
Figure 8B:
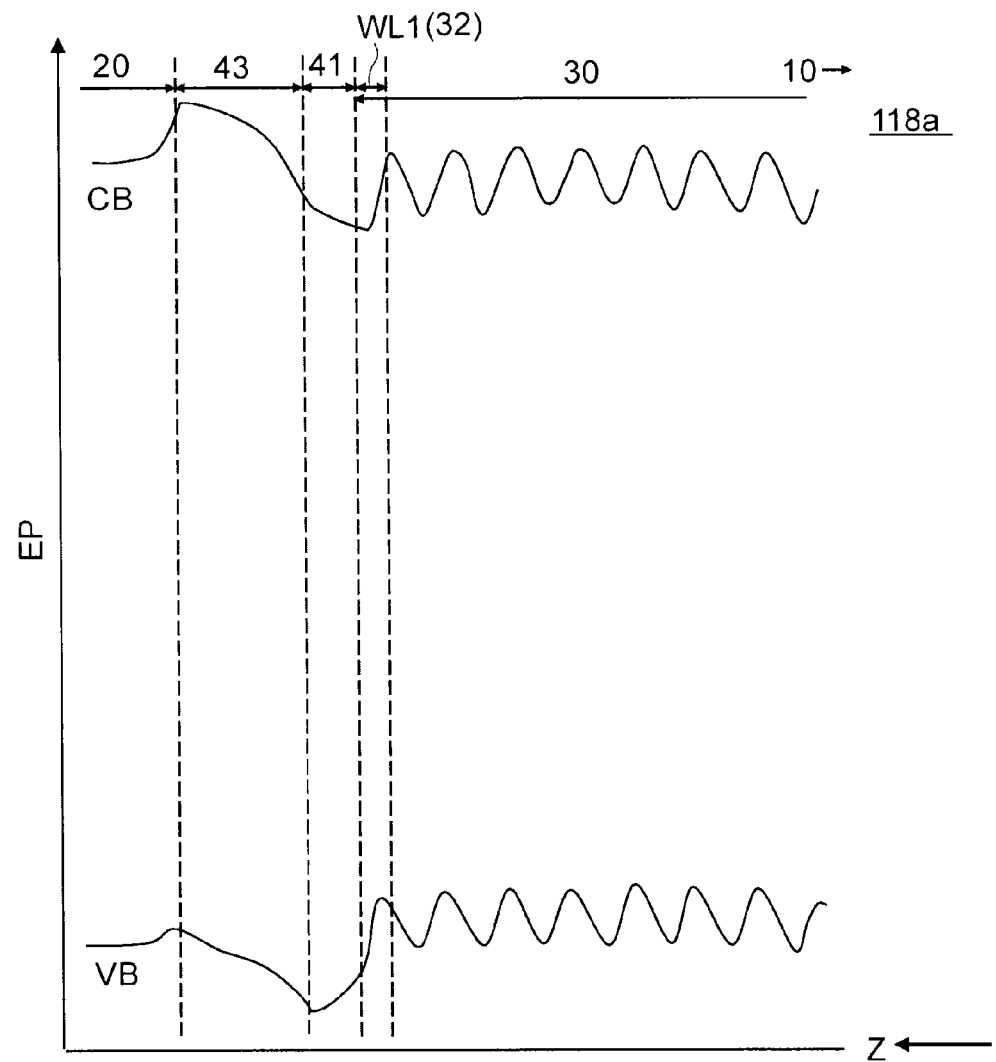

FIG. 8A and FIG. 8B are graphs illustrating characteristics of the semiconductor light emitting element of the reference example.

These figures correspond to the semiconductor light emitting element 118a of the reference example. The current is set to 350 mA in this simulation. In this case, the voltage is 3.45 V. Thus, for the same current, the voltage is higher for the semiconductor light emitting element 118a than for the semiconductor light emitting element 111a.

It can be seen from FIG. 8B that for the conduction band CB, the difference between the energy EP of the third layer 43 and the energy of the first well layer WL1 is small. In other words, the potential of the third layer 43 is low. Therefore, the suppression of the overflow of the electrons from the first well layer WL1 is insufficient. On the other hand, for the valence band VB, a dip occurs in the energy EP at the boundary between the first layer 41 and the third layer 43. The dip functions as a barrier for the holes; and the holes are not easily injected into the first well layer WL1. Therefore, the operating voltage is high.

It can be seen from FIG. 8A that the electron carrier density Ce is relatively high in the first well layer WL1. However, the hole carrier density Ch is low in the first well layer WL1. Therefore, the luminous efficiency is low. Further, in the first layer 41, the electron carrier density Ce is high; and the electrons accumulate in the first layer 41. In the first layer 41, the hole carrier density Ch is low; and radiative recombination does not occur effectively. The electrons of the first layer 41 do not contribute to the light emission and result in an absorption loss. Therefore, the efficiency decreases.

In the semiconductor light emitting element 118a, the hole carrier density Ch is higher in the well layer 32 of the n-type semiconductor layer 10 side than in the well layer 32 of the p-type semiconductor layer 20 side. Also, the electron carrier density Ce is lower in the well layer 32 of the n-type semiconductor layer 10 side than in the well layer 32 of the p-type semiconductor layer 20 side. This also causes the efficiency to decrease.

In the semiconductor light emitting element 118a of the reference example, a large dip occurs in the energy EP at the periphery of the light emitting unit 30. In the case where a dip occurs in the energy EP, the current does not flow easily in low-voltage driving; and it is difficult to obtain a sufficient light emission.

For example, when the bias voltage is increased in the semiconductor light emitting element 118a, in the first p-side layer 21 at the interface vicinity between the first p-side layer 21 and the layer (the third layer 43) having the high Al composition ratio, the energy level of the band becomes higher; the dip of the band becomes small; and the holes can be injected. At this time, the bias voltage is applied also to the other layers of the semiconductor light emitting element. Compared to the n-side of the light emitting unit 30, the energy levels for the p-side of the light emitting unit 30 and the third layer 43 shift lower; and therefore, the barrier effect for the electrons injected from the n-side into the light emitting unit 30 decreases. The electrons move through the third layer 43 to overflow to the p-side; and the injection efficiency of the current into the light emitting unit 30 is low. Therefore, an energy shift occurs in the third layer 43 simultaneously to when the current starts to flow. That is, the electron overflow occurs simultaneously to when the current starts to flow. Therefore, in the semiconductor light emitting element 118a, the luminous efficiency decreases easily particularly in large-current driving.

Conversely, in the semiconductor light emitting element 111a according to the embodiment, the bandgap energy is large in the third layer 43; and the suppression effect of the electron overflow is large. The lowering of the energy level in the first layer 41 and third layer 43 is suppressed by providing the second layer 42 on the light emitting unit 30 (the first well layer WL1) side of the third layer 43. Therefore, in large-current driving as well, a large electron overflow effect is obtained. Therefore, in the semiconductor light emitting element 111a, a high efficiency is obtained even in large-current driving.

In the embodiment, the bandgap energy of the first layer 41 is larger than the bandgap energy of the first well layer WL1; the electrons are trapped in the first well layer WL1; and the overflow of the electrons into the second layer 42 is suppressed.

Further, because the second layer 42 is interposed between the first layer 41 and the third layer 43, for example, the holes are trapped in the second layer 42. As the holes accumulate in the second layer 42, for example, the voltage increase when the holes are transported into the first well layer WL1 is suppressed. Because the overflow of the electrons from the first well layer WL1 into the second layer 42 is suppressed, the amount of the electrons accumulating in the second layer 42 is low. Further, the electrons from the first well layer WL1 that move through the third layer 43 to overflow can be suppressed.

In the semiconductor light emitting element according to the embodiment, a high efficiency is obtained in a wide bias voltage range by the fluctuation of the energy at the periphery of the light emitting unit 30 being suppressed.

Generally, there is a tendency for the electrons to overflow easily from the light emitting unit 30. Therefore, there is a configuration in which an overflow-preventing layer is provided on the p-side semiconductor layer side. In the case where a p-type impurity (Mg, etc.) is added to the overflow-preventing layer, the p-type impurity is added at a high concentration because the activation rate of the p-type impurity is low. In the case where the p-type impurity is added at a high concentration, the quality of the crystal degrades easily. Further, the p-type impurity diffuses and reduces the luminous efficiency of the light emitting unit.

In the embodiment, high crystallinity can be maintained by using the stacked unit 40 having the configuration recited above. Further, the diffusion of Mg can be suppressed; and a high luminous efficiency is obtained. Further, the dip in the energy at the periphery of the light emitting unit 30 can be suppressed. Thereby, the efficiency can be increased.

An example of characteristics when the Al composition ratio x2 of the second layer 42 of the semiconductor light emitting element according to the embodiment is changed will now be described.

Figure 9:
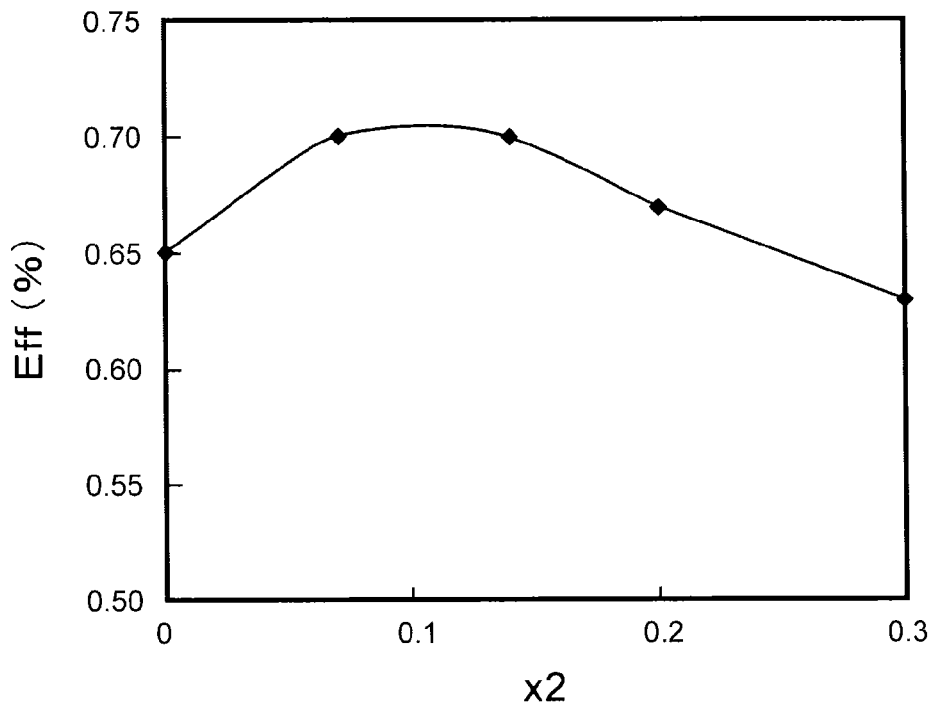
FIG. 9 is a graph showing a characteristic of the semiconductor light emitting element.

FIG. 9 is a graph illustrating a characteristic of the semiconductor light emitting element.

FIG. 9 shows an example of simulation results of the efficiency of the semiconductor light emitting element. In FIG. 9, the horizontal axis is the Al composition ratio x2 of the second layer 42. The vertical axis is the luminous efficiency Eff. The luminous efficiency Eff is the value when the current density is 140 A/cm$^2$. The luminous efficiency Eff corresponds to, for example, the efficiency when operating at a high current density.

The following model is used in the simulation.

The light emitting unit 30 has a MQW configuration. The number of well layers 32 is 8. In the light emitting unit 30, the well layer 32 is a $Ga_{0.86}In_{0.14}N$ layer. The thickness of the well layer 32 is 3.5 nm. The barrier layer 31 is a GaN layer. The thickness of the barrier layer 31 is 5 nm. In the example, the wavelength of the light emitted from the light emitting unit 30 is about 450 nm. In other words, blue light is emitted.

The first layer 41 is an $Al_{0.15}Ga_{0.78}In_{0.07}N$ layer. The first thickness d1 is 7 nm. The second layer 42 is an $Al_{x2}Ga_{1-x2-0.07}In_{0.07}N$ layer. The second Mg concentration is not less than $1 \times 10^{19}$ cm$^{-3}$ and not more than $1 \times 10^{20}$ cm$^{-3}$. The second thickness d2 is 2 nm or less. The third layer 43 is an $Al_{0.3}Ga_{0.7}N$ layer. The third Mg concentration is not less than $1 \times 10^{18}$ cm$^{-3}$ and not more than $2 \times 10^{19}$ cm$^{-3}$. The third thickness d3 is 24 nm.

In the simulation, the Al composition ratio x2 of the second layer 42 is modified. The bandgap energy changes in conjunction with the Al composition ratio x2. This simulation corresponds to a simulation when the bandgap energy (the second bandgap energy) of the second layer 42 is changed.

It can be seen from FIG. 9 that the luminous efficiency Eff is low when the Al composition ratio x2 of the second layer 42 is 0.3. In other words, the luminous efficiency Eff is low when, for example, the Al composition ratio of the second layer 42 approaches the Al composition ratio of the third layer 43.

The luminous efficiency Eff is low also when the Al composition ratio x2 of the second layer 42 is too low (e.g., substantially 0). In other words, the luminous efficiency Eff is low also when the Al composition ratio of the second layer 42 approaches the Al composition ratio of the first well layer WL1.

When the Al composition ratio x2 of the second layer 42 is too low, for example, recombination of the carriers in the second layer 42 occurs easily. Therefore, it is considered that the luminous efficiency Eff decreases. When the Al composition ratio x2 of the second layer 42 is too high, for example, a dip in the energy occurs between the third layer 43 and the well layer 32 furthest on the p-side. The accumulated amount of the holes in the second layer 42 decreases. Thereby, the injection efficiency of the holes into the well layer 32 decreases; and the luminous efficiency decreases. The difference between the bandgap energies of the first layer 41 and the second layer 42 becomes small; and the holes no longer accumulate easily inside the second layer 42. Thereby, the resistance for the holes to be injected from the third layer 43 into the well layer 32 increases.

Conversely, the luminous efficiency Eff is high in the case where the Al composition ratio x2 of the second layer 42 is between the Al composition ratio x3 of the third layer 43 and the Al composition ratio x1 of the first well layer WL1. The Al composition ratio x2 of the second layer 42 is, for example, more than 0 but not more than 0.2. It is more favorable for the Al composition ratio x2 of the second layer 42 to be, for example, not less than 0.08 and not more than 0.15. Thereby, a high efficiency is obtained for a semiconductor light emitting element having a blue light emission.

In the case where the differences between the Al composition ratio of the well layer 32 and the Al composition ratios of the first layer 41, the second layer 42, and the third layer 43 are large, the effect of the internal charge of the crystal between the stacked unit 40 and the well layer 32 becomes large. For example, in the case where the Al composition ratio of the second layer 42 approaches the Al composition ratio of the well layer 32, the effect on the charge due to the crystal polarization for the well layer 32 occurs mainly due to the first layer 41. A large amount of charge is generated by the crystal polarization in the region between the third layer 43 that has the highest Al composition ratio and the second layer 42 that has a low Al composition. In such a case, Mg is added to the second layer 42 at a high concentration; and the effect of the charge generated by the crystal polarization to the outside is shielded. Therefore, the effect of the potential fluctuation due to the crystal polarization does not occur directly between the well layer 32 and the third layer 43 having the highest Al composition ratio. Therefore, the dip in the energy between the light emitting unit 30 and the third layer 43 is small. Therefore, the decrease of the luminous efficiency Eff is suppressed.

Another simulation result of the characteristic of the semiconductor light emitting element will now be described.

The following model is used in this simulation.

The light emitting unit 30 has a MQW configuration. The number of well layers 32 is 8. In the light emitting unit 30, the well layer 32 is an $Al_{0.63}Ga_{0.37}N$ layer. The thickness of the well layer 32 is 3 nm. The barrier layer 31 is an $Al_{0.77}Ga_{0.23}N$ layer. The thickness of the barrier layer 31 is 5 nm. The wavelength of the light emitted from the light emitting unit 30 is, for example, 254 nm. In other words, ultraviolet light is emitted.

In the example, the first layer 41 is an $Al_{0.77}Ga_{0.23}In_{0.0005}N$ layer. The first Mg concentration Mc1 is $1 \times 10^{18}$ cm$^{-3}$. The first thickness d1 is 6 nm. The second layer 42 is an $Al_{x2}Ga_{(1-x2-0.01)}In_{0.01}N$ layer. The second Mg concentration Mc2 is $0.1 \times 10^{20}$ cm$^{-3}$. The second thickness d2 is 5 nm. The third layer 43 is an $Al_{0.95}Ga_{0.05}N$ layer. The third Mg concentration Mc3 is $2 \times 10^{19}$ cm$^{-3}$. The third thickness d3 is 12 nm. Otherwise, the configuration described in regard to the semiconductor light emitting element 111a is applied to the configuration.

Figure 10:
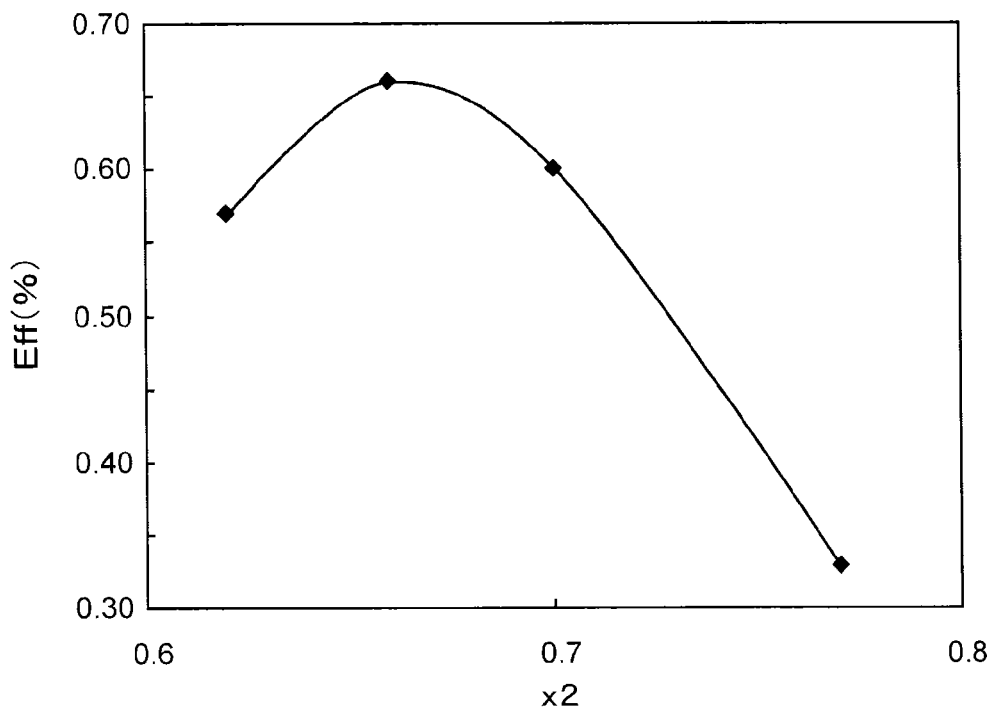
FIG. 10 is a graph showing the characteristic of the semiconductor light emitting element according to the first embodiment.

FIG. 10 is a graph illustrating the characteristic of the semiconductor light emitting element according to the first embodiment.

As shown in FIG. 10, the luminous efficiency Eff is low when the Al composition ratio x2 of the second layer 42 is 0.77. In other words, the luminous efficiency Eff is low when the Al composition ratio x2 of the second layer 42 is high and is the same as the Al composition ratio x1 of the first layer 41. The luminous efficiency Eff decreases further as the Al composition ratio x2 becomes higher than the Al composition ratio x1.

On the other hand, the luminous efficiency Eff is low also when the Al composition ratio x2 of the second layer 42 is low, i.e., 0.62. The luminous efficiency Eff is low also when the Al composition ratio x2 of the second layer 42 approaches the Al composition ratio of the well layer 32.

Conversely, a high luminous efficiency Eff is obtained when the Al composition ratio x2 of the second layer 42 is, for example, more than 0.62 but not more than 0.77. It is favorable for the Al composition ratio x2 of the second layer 42 to be, for example, not less than 0.65 and not more than 0.73. Thereby, a high efficiency is obtained in the ultraviolet light emitting semiconductor light emitting element. For example, the difference between the bandgap energies of the second layer 42 and the well layer 32 and the difference between the bandgap energies of the second layer 42 and the first layer 41 are about the energy at room temperature. Therefore, even when affected by the heat distribution of the carriers, the large/small relationship of the bandgap energy is distinct between the well layer 32 and the second layer 42 and between the second layer 42 and the first layer 41. Thereby, a high efficiency is obtained.

In the embodiment, when the Al composition ratio of the well layer 32 is greater than 0.6, the increase effect of the luminous efficiency due to providing the second layer 42 is large. For example, when the Al composition ratio of the well layer 32 is greater than 0.6, the Al composition ratio of the third layer 43 is set to be 0.75 or more to sufficiently obtain the overflow suppression effect of the electrons. An impurity (Mg) is added to the third layer 43 to obtain carriers. When the Al composition ratio is 0.75 or more, the decrease of the activation rate of the impurity (the Mg) of the third layer 43 proceeds abruptly. In such a case, in the embodiment, the second layer 42 that has a low Al composition ratio (Al may not be included) is provided; and the Mg concentration of the second layer 42 is set to be high. Thereby, the carriers can be supplied from the second layer 42 into the p-side (in particular, the stacked unit 40) of the light emitting unit 30; and a sufficient current can be caused to flow at a low bias voltage. Therefore, even when the Al composition ratio of the well layer 32 exceeds 0.6 and the Al composition ratio of the third layer 43 is high, i.e., 0.75, a low operating voltage can be maintained; and a high luminous efficiency can be obtained. Such an effect occurs when the Al composition ratio is 0.75 or more; and the effect becomes more pronounced when the Al composition ratio is 0.8 or more. In other words, the effect of applying the embodiment is obtained markedly when the Al composition ratio of the well layer 32 exceeds 0.6. The effect of the efficiency increase is high when the Al composition ratio of the third layer 43 is 0.8 or more.

In the embodiment, for example, an AlGaN layer may be used as the first buffer layer 61. For example, the composition of the AlGaN layer changes in stages, linearly, or a combination in stages and linearly from the substrate 50 to the n-type semiconductor layer 10. In such a case, the Al composition ratio on the substrate 50 side may be set to be high; and the Ga composition ratio on the n-type semiconductor layer 10 side may be set to be high.

In the embodiment, for example, a GaN layer containing Si may be used as the second buffer layer 62. For example, a layer including a Si-containing layer and a GaN layer may be used as the second buffer layer 62. An AlGaN layer may be used as the second buffer layer 62. A layer including an AlN layer and an AlGaN layer may be used as the second buffer layer 62. A multilayered structural body in which multiple AlGaN layers and multiple GaN layers are stacked alternately may be used as the second buffer layer 62. A multilayered structural body in which multiple AlN layers and multiple GaN layers are stacked alternately may be used as the second buffer layer 62.

In the semiconductor light emitting element of the example shown in FIG. 10, the first Mg concentration Mc1 of the first layer 41 is, for example, not more than $5 \times 10^{18}$ cm$^{-3}$. The second Mg concentration Mc2 of the second layer 42 is, for example, not less than $0.5 \times 10^{19}$ cm$^{-3}$ and not more than $5 \times 10^{20}$ cm$^{-3}$. The third Mg concentration Mc3 of the third layer 43 is, for example, not less than $0.2 \times 10^{19}$ cm$^{-3}$ and not more than $5 \times 10^{19}$ cm$^{-3}$. By using these values, for example, the diffusion of the Mg can be suppressed; and current leakage can be suppressed. Thereby, the decrease of the light emission intensity can be suppressed.

The second buffer layer 62 may be provided on the first buffer layer 61. The first buffer layer 61 may be provided on the second buffer layer 62. A multilayered structural body in which the multiple first buffer layers 61 and the multiple second buffer layers 62 are stacked alternately may be used.

Figure 11A:
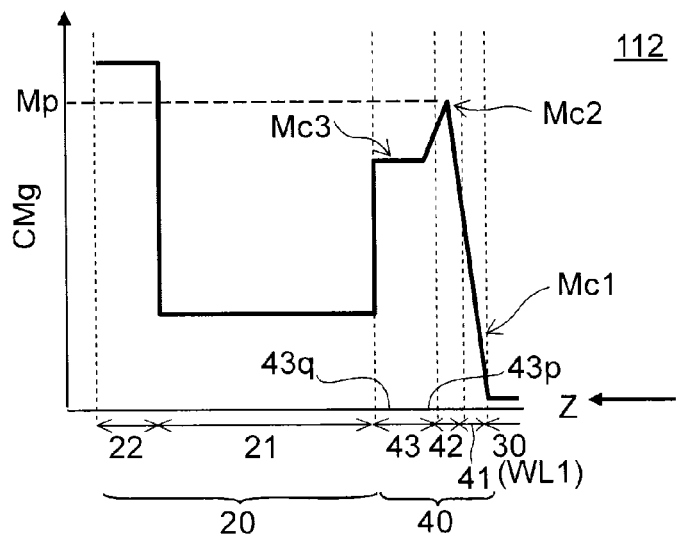
FIG. 11A to FIG. 11C are schematic views showing another semiconductor light emitting element according to the first embodiment.
Figure 11B:
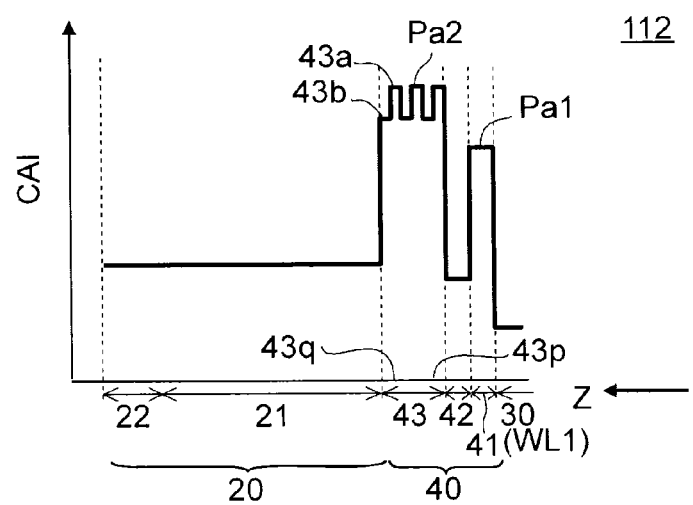
Figure 11C:
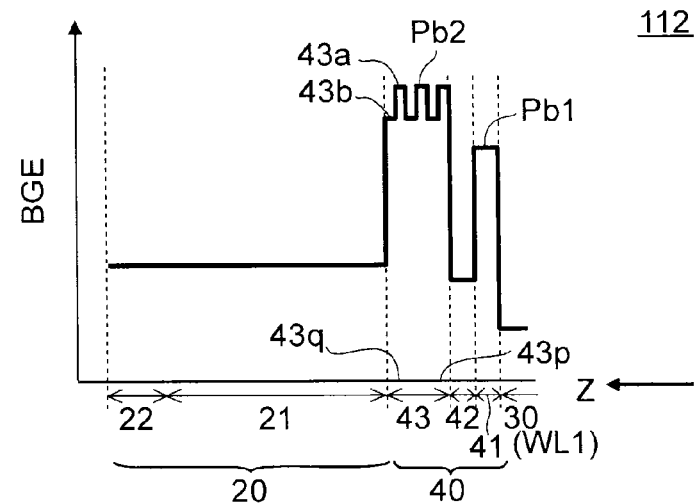

FIG. 11A to FIG. 11C are schematic views illustrating another semiconductor light emitting element according to the first embodiment.

FIG. 11A, FIG. 11B, and FIG. 11C schematically illustrate the profile of the Mg concentration, the profile of the Al composition ratio, and the profile of the bandgap energy of the semiconductor light emitting element 112 according to the embodiment, respectively.

In the semiconductor light emitting element 112 as shown in FIG. 11C, the third layer 43 includes multiple large bandgap energy layers 43a and a small bandgap energy layer 43b. The small bandgap energy layer 43b is provided between the multiple large bandgap energy layers 43a. The bandgap energy of the small bandgap energy layer 43b is smaller than the bandgap energy of the large bandgap energy layer 43a. The bandgap energy of the small bandgap energy layer 43b is not less than the bandgap energy of the second layer 42. It is favorable for the bandgap energy of the small bandgap energy layer 43b to be larger than the bandgap energy of the second layer 42 because the carrier block effect is large. For example, the bandgap energy of the small bandgap energy layer 43b is greater than the bandgap energy of the first layer 41. Thereby, the carrier block effect is large, which is favorable.

As shown in FIG. 11B, the large bandgap energy layer 43a is a high Al composition layer. The small bandgap energy layer 43b is a low Al composition layer. The Al composition ratio of the small bandgap energy layer 43b is lower than the Al composition ratios of the multiple large bandgap energy layers 43a.

Thus, in the example, the third layer 43 has a stacked structure. Otherwise, the structure is similar to those described in regard to the semiconductor light emitting elements 110 and 111.

For example, in the example as shown in FIG. 11A as well, the Mg concentration of the second layer 42 is higher than the Mg concentration of the first layer 41. The Mg concentration of the second layer 42 is higher than the Mg concentration of the large bandgap energy layer 43a and higher than the Mg concentration of the small bandgap energy layer 43b.

Thus, a stacked structure is applicable to the third layer 43. In the semiconductor light emitting element 112 as well, the efficiency can be increased.

In the embodiment, the number of large bandgap energy layers 43a and the number of small bandgap energy layers 43b provided in the third layer 43 are arbitrary.

The Al composition ratio of the small bandgap energy layer 43b is, for example, higher than the Al composition ratio of the well layer 32. For example, the Al composition ratio of the small bandgap energy layer 43b is not less than the Al composition ratio of the barrier layer 31. The Al composition ratio of the small bandgap energy layer 43b may be, for example, the same as, higher than, or lower than the Al composition ratio of the first layer 41.

The Al composition ratio or bandgap energy of the third layer 43 is taken to be an average Al composition ratio or bandgap energy considering the thicknesses of the large bandgap energy layer 43a and the small bandgap energy layer 43b.

An example of simulation results of characteristics of the semiconductor light emitting element 112 will now be described.

Figure 12A:
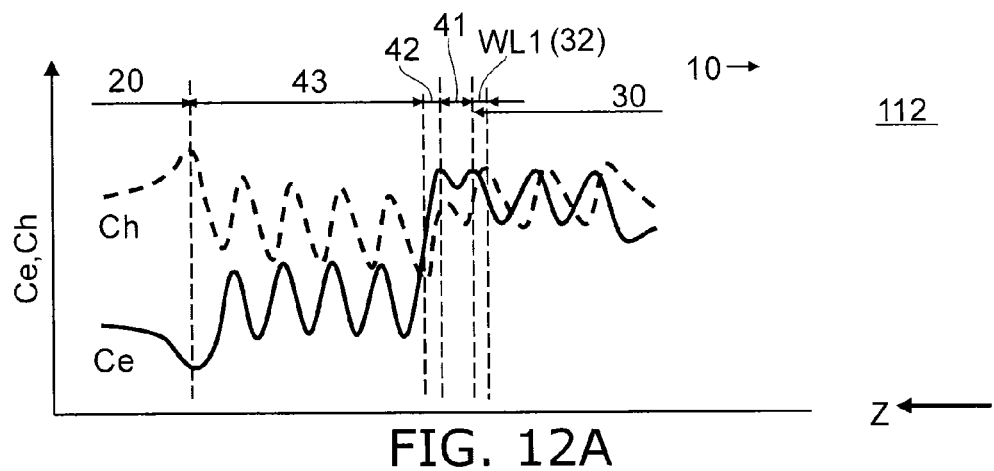
FIG. 12A and FIG. 12B are graphs showing characteristics of the semiconductor light emitting element according to the first embodiment.
Figure 12B:
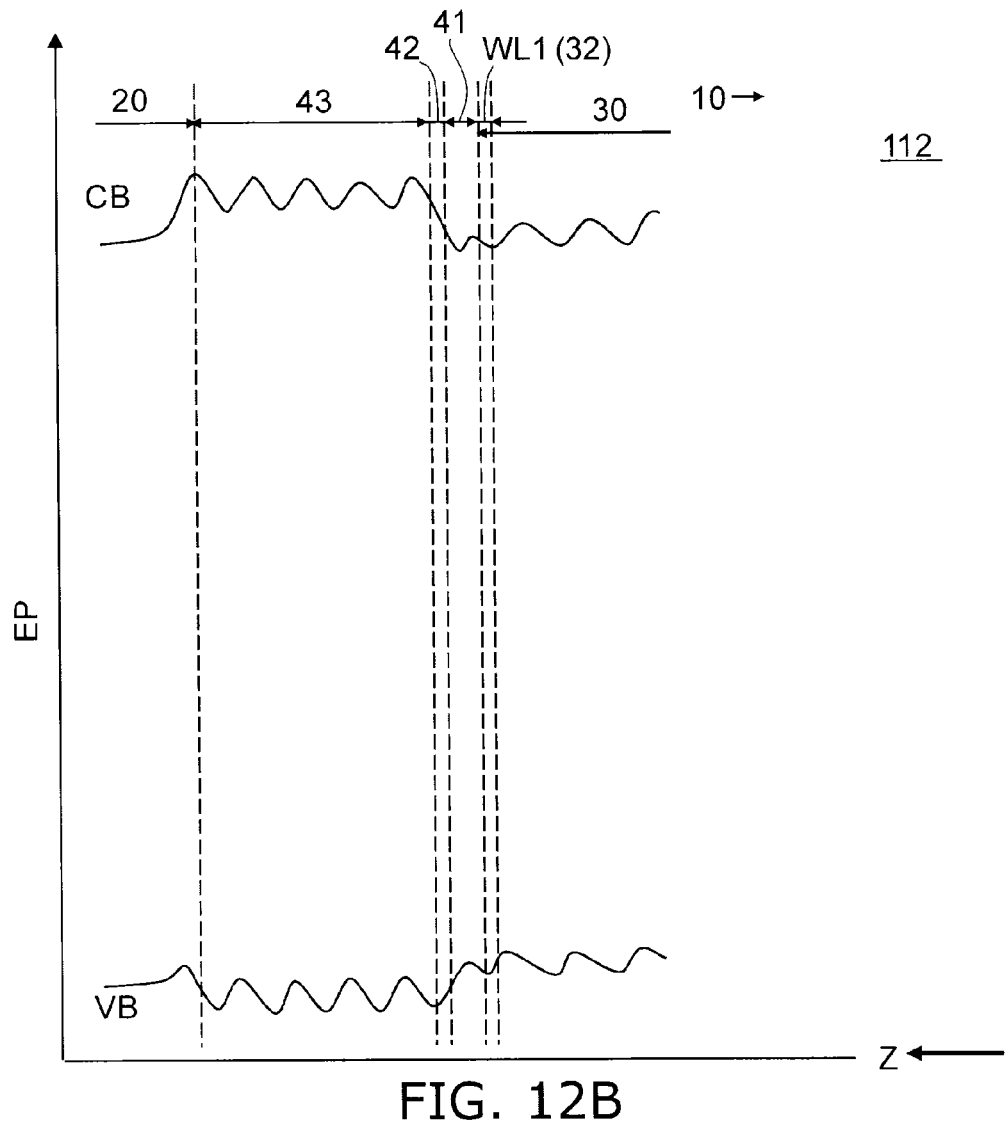

FIG. 12A and FIG. 12B are graphs illustrating characteristics of the semiconductor light emitting element according to the first embodiment.

These figures illustrate the simulation results of the semiconductor light emitting element 112 according to the embodiment. FIG. 12A illustrates the electron carrier density Ce and the hole carrier density Ch. FIG. 12B illustrates the energy EP; and the valence band VB and the conduction band CB are shown. In these figures, the horizontal axis is the Z-axis direction position.

In the example, the light emitting unit 30 has a MQW configuration. The number of well layers 32 is 3. The well layer 32 is an $Al_{0.68}Ga_{0.32}N$ layer. The thickness of the well layer 32 is 3.5 nm. The barrier layer 31 is an $Al_{0.77}Ga_{0.23}N$ layer. The thickness of the barrier layer 31 is 5 nm. In the example, the wavelength of the light emitted from the light emitting unit 30 is 254 nm. In other words, ultraviolet light is emitted.

In the example, the first layer 41 includes an $Al_{0.77}Ga_{0.23}N$ layer. The first Mg concentration Mc1 is $2\times10^{17}$ cm$^{-3}$. The first thickness d1 is 5 nm. The second layer 42 includes an $Al_{0.70}Ga_{0.30}N$ layer. The second Mg concentration Mc2 is $1\times10^{20}$ cm$^{-3}$. The second thickness d2 is 2 nm. In the third layer 43, the large bandgap energy layer 43a is an $Al_{0.95}Ga_{0.05}N$ layer. The thickness of the large bandgap energy layer 43a is 5 nm. The small bandgap energy layer 43b is an $Al_{0.77}Ga_{0.23}N$ layer. The thickness of the small bandgap energy layer 43b is 3 nm. The number of large bandgap energy layers 43a is 5; and the number of small bandgap energy layers 43b is 5. These layers are stacked alternately. The large bandgap energy layer 43a contacts the second layer 42. The third Mg concentration Mc3 is $1\times10^{19}$ cm$^{-3}$. Otherwise, the configuration described in regard to the semiconductor light emitting element 111a is applied to the configuration.

The characteristics illustrated in FIG. 12A and FIG. 12B are characteristics when the current density is 20 A/cm$^2$.

It can be seen from FIG. 12A that the electron carrier density Ce and the hole carrier density Ch are high in the well layer 32 (the first well layer WL1) furthest on the p-side. Therefore, in the semiconductor light emitting element 112, a high luminous efficiency is obtained.

As shown in FIG. 12B, the energy EP of the third layer 43 is large in the region from the first layer 41 through the second layer 42 to the third layer 43. The third layer 43 functions as a layer that suppresses the electron overflow.

Figure 13A:
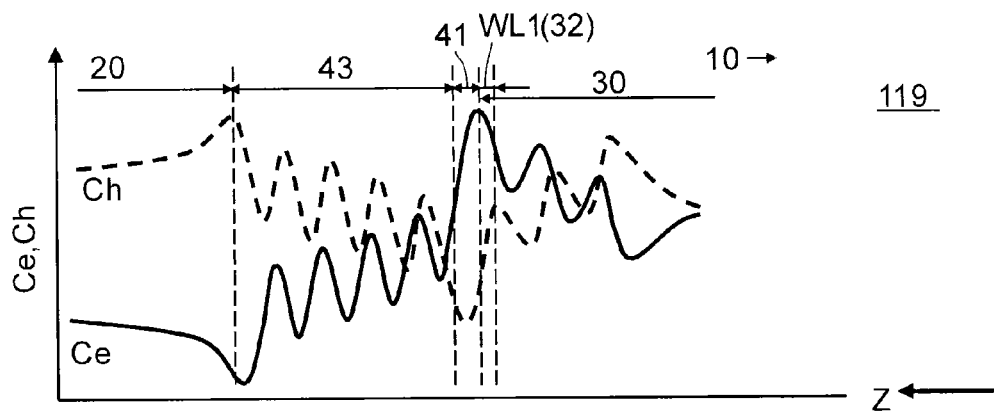
FIG. 13A and FIG. 13B are graphs showing characteristics of a semiconductor light emitting element of a reference example.
Figure 13B:
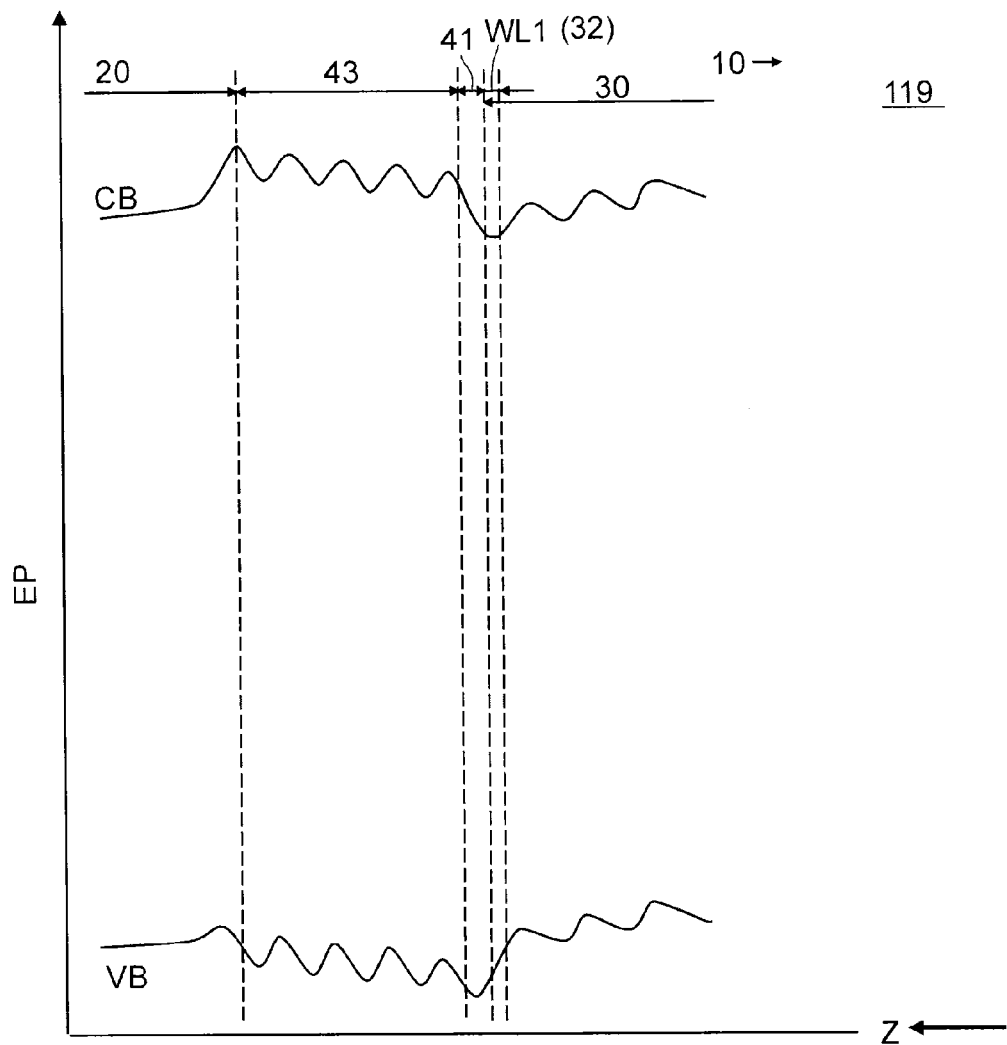
Figure 14A:
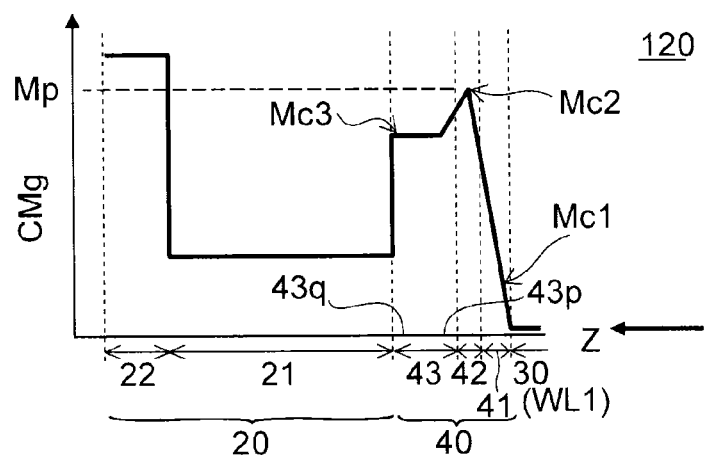
FIG. 14A to FIG. 14D are schematic views showing another semiconductor light emitting element according to the first embodiment.
Figure 14B:
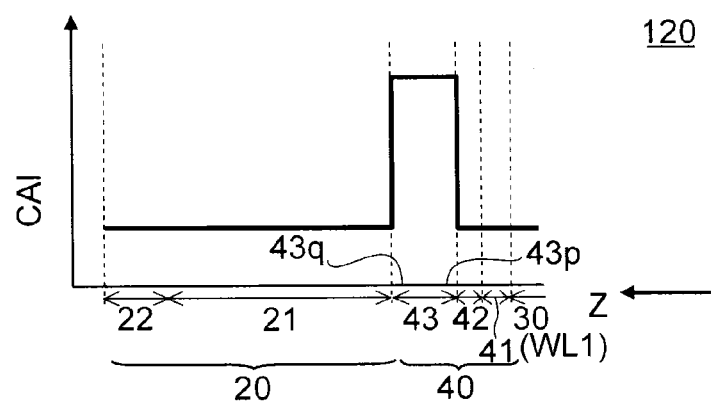
Figure 14C:
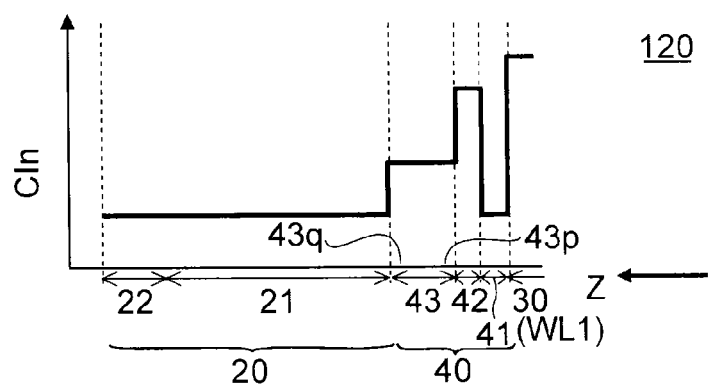
Figure 14D:
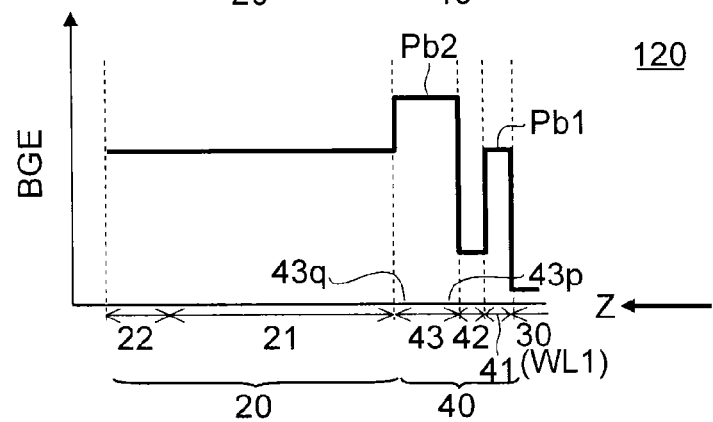

FIG. 13A and FIG. 13B are graphs illustrating characteristics of a semiconductor light emitting element of a reference example.

These figures illustrate simulation results of the semiconductor light emitting element 119 of the reference example. The second layer 42 is not provided in the semiconductor light emitting element 119. Otherwise, the semiconductor light emitting element 119 is similar to the semiconductor light emitting element 112.

It can be seen from FIG. 13A that the hole carrier density Ch is high in the well layer 32 on the n-side but low in the well layer 32 on the p-side. On the other hand, the electron carrier density Ce is high in the well layer 32 furthest on the p-side. Therefore, the luminous efficiency is low.

It can be seen from FIG. 13B that for the conduction band CB, the energy EP decreases at the portion inside the third layer 43 on the first layer 41 side. In other words, the barrier effect for the electrons is small at the portion of the third layer 43 on the first layer 41 side. The suppression effect of the overflow of the electrons is small. The carriers overflow; and the utilization efficiency of the current is low. Therefore, the luminous efficiency is low.

On the other hand, for the valence band VB, a dip occurs in the energy EP at the boundary between the well layer 32 (the first well layer WL1) and the first layer 41. The dip forms a barrier for the holes. Therefore, in the semiconductor light emitting element 119, the operating voltage increases.

Further, as shown in FIG. 13B, for the conduction band CB and the valence band VB, the energy EP of the small bandgap energy layer 43b decreases at the interface between the large bandgap energy layer 43a (the high Al composition layer) and the small bandgap energy layer 43b (the low Al composition layer). This occurs due to the difference between the electronegativities of these layers.

In the semiconductor light emitting element 119, when the drive voltage is increased, the electron barrier of the third layer 43 degrades; and the trapping effect of the current in the well layer 32 decreases. For the same current density, the luminous efficiency of the semiconductor light emitting element 119 is, for example, ⅕ of the luminous efficiency of the semiconductor light emitting element 112 according to the embodiment.

In the semiconductor light emitting element 119, the light emission wavelength is short; and the Al composition ratio of the third layer 43 is high. Therefore, the impurity state is deep; and it is difficult to obtain p-type carriers (hole carriers) at a high concentration. In the case where the well layer 32 includes an AlGaN-based material, this effect becomes particularly pronounced when the Al composition ratio of the third layer 43 exceeds 0.8.

In the semiconductor light emitting element 112 according to the embodiment, a material having a bandgap energy that is larger than that of the well layer 32 and smaller than that of the third layer 43 may be used as the second layer 42. In such a case, the activation rate of the p-type impurity can be increased easily because the bandgap energy of the second layer 42 is low. In particular, the p-type impurity concentration can be increased easily due to the effect of the Al composition ratio being low, etc.

For example, in the semiconductor light emitting element 112 in which the second layer 42 is provided and the third layer 43 includes the stacked structure of the large bandgap energy layer 43a and the small bandgap energy layer 43b, a particularly high luminous efficiency is obtained when the Al composition ratio of the well layer 32 is greater than 0.6.

In the example shown in FIG. 11A to FIG. 11C, the first Mg concentration Mc1 of the first layer 41 is, for example, not more than $5 \times 10^{18}$ cm$^{-3}$. The second Mg concentration Mc2 of the second layer 42 is, for example, not less than $0.5 \times 10^{19}$ cm$^{-3}$ and not more than $5 \times 10^{20}$ cm$^{-3}$. The third Mg concentration Mc3 of the third layer 43 is, for example, not less than $0.2 \times 10^{19}$ cm$^{-3}$ and not more than $5 \times 10^{19}$ cm$^{-3}$.

FIG. 14A to FIG. 14D are schematic views illustrating another semiconductor light emitting element according to the first embodiment.

FIG. 14A, FIG. 14B, FIG. 14C, and FIG. 14D schematically illustrate the profile of the Mg concentration CMg, the profile of the Al composition ratio CAl, the profile of an In composition ratio CIn, and the profile of the bandgap energy BGE of the semiconductor light emitting element 120 according to the embodiment, respectively.

In the semiconductor light emitting element 120 as well, the n-type semiconductor layer 10 (not shown) that includes a nitride semiconductor, the p-type semiconductor layer 20 that includes a nitride semiconductor, and the light emitting unit 30 are provided. The light emitting unit 30 includes the first well layer WL1 (the well layer 32) provided between the n-type semiconductor layer 10 and the p-type semiconductor layer 20. The first well layer WL1 includes a nitride semiconductor. In such a case as well, the stacked unit 40 that includes the first to third layers 41 to 43 is provided.

The first layer 41 is provided between the first well layer WL1 and the p-type semiconductor layer 20 and has the first Mg concentration Mc1. The first layer 41 includes $Al_{x1}Ga_{1-x1-y1}In_{y1}N$ (0≤x1<1, 0≤y1<1, and x1+y1≤1).

The second layer 42 is provided between the first layer 41 and the p-type semiconductor layer 20 and has the second Mg concentration Mc2 that is higher than the first Mg concentration Mc1. The second layer 42 includes $Al_{x2}Ga_{1-x2-y2}In_{y2}N$ (0≤x2≤x1, y1<y2<1, and x2+y2≤1).

The third layer 43 is provided between the second layer 42 and the p-type semiconductor layer 20 and has the third Mg concentration Mc3 that is higher than the first Mg concentration Mc1 and lower than the second Mg concentration Mc2. The third layer 43 includes $Al_{x3}Ga_{1-x3-y3}In_{y3}N$ (x1<x3<1, 0<y3<1, and x3+y3≤1).

For example, the bandgap energy of the first layer 41 is larger than the bandgap energy of the first well layer WL1. The bandgap energy of the second layer 42 is smaller than the bandgap energy of the first layer 41. The bandgap energy of the second layer 42 is larger than the bandgap energy of the first well layer WL1. The bandgap energy of the third layer 43 is larger than the bandgap energy of the first layer 41.

For example, the first well layer WL1 may include In. In such a case, for example, the In composition ratio y2 of the second layer 42 is lower than the In composition ratio of the first well layer WL1.

In the example, the first layer 41 contacts the first well layer WL1.

Thus, in the semiconductor light emitting element 120, the Mg concentration is set to be high in the second layer 42 that has a low bandgap energy. Thereby, a semiconductor light emitting element having a high efficiency can be provided.

In the semiconductor light emitting element 120, the large bandgap energy layer 43a and the small bandgap energy layer 43b may be provided in the third layer 43.

In the embodiment, the first layer 41 may include medium In composition (Al)Ga(In)N having a low Mg concentration (to which Mg may not be added); the second layer 42 may include high In composition (Al)GaInN having a high Mg concentration; and the third layer 43 may include low In composition AlGa(In)N having a medium Mg concentration. In such a case as well, the controllability of the Mg concentration of the second layer 42 is good. In the second layer 42, the desired Mg concentration is obtained with good reproducibility and good controllability.

Figure 15:
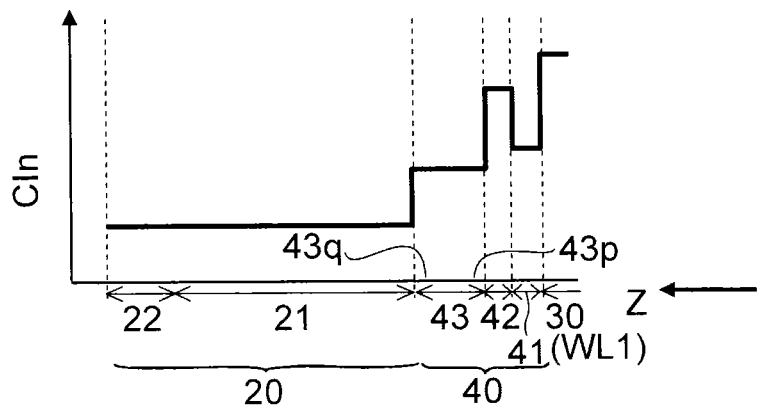
FIG. 15 is a schematic view showing another semiconductor light emitting element according to the first embodiment.

FIG. 15 is a schematic view showing another semiconductor light emitting element according to the first embodiment.

FIG. 15 shows an another example of the profile of an In composition ratio CIn in the semiconductor light emitting element 120. As shown in this figure, the In concentration CIn in the first layer 41 is preferably higher than that in the third layer 43. In this example, the profile of the Mg concentration CMg, the profile of the Al composition ratio CAl, and the profile of the bandgap energy BGE can be same as those shown in FIG. 14A, FIG. 14B, and FIG. 14D.

Figure 16:
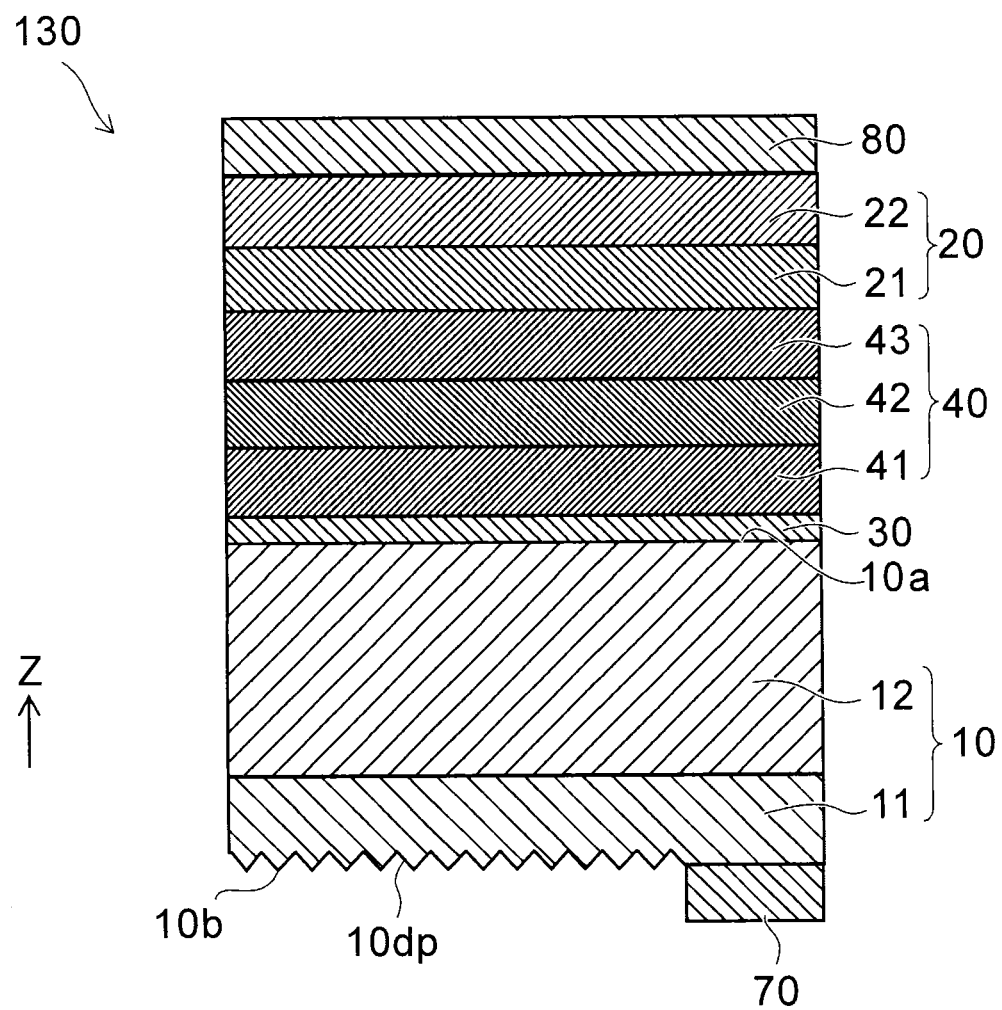
FIG. 16 is a schematic structure cross-sectional view showing another semiconductor light emitting element according to the first embodiment.

FIG. 16 is a schematic structure cross-sectional view illustrating another semiconductor light emitting element according to the first embodiment.

As shown in FIG. 16, the n-type semiconductor layer 10, the light emitting unit 30, the stacked unit 40, and the p-type semiconductor layer 20 are disposed between the first electrode 70 and the second electrode 80 in the semiconductor light emitting element 130. The first electrode 70 is provided on the second major surface 10b of the n-type semiconductor layer 10.

In the semiconductor light emitting element 130, for example, the second major surface 10b is used as the light extraction surface. In the semiconductor light emitting element 130, an unevenness 10dp is provided in the second major surface 10b. The light extraction efficiency from the semiconductor light emitting element 130 is increased by the unevenness 10dp. In the example, the unevenness 10dp is provided in the surface of the first n-side layer 11. Otherwise, the configurations of the semiconductor light emitting elements and the modifications of the semiconductor light emitting elements according to the embodiments described above are applicable to the configuration.

For example, in the semiconductor light emitting element 130, light having a peak wavelength of, for example, 254 nm is emitted from the light emitting unit 30. The light of a semiconductor light emitting element that emits ultraviolet light is absorbed easily. In the semiconductor light emitting element 130, there is little light absorption for the layers that are used.

An example of a method for manufacturing the semiconductor light emitting element 130 will now be described.

The buffer unit 60 (not shown) is formed on the substrate 50 (not shown).

The substrate 50 includes, for example, an AlN substrate. For example, a first AlN layer is formed as the first buffer layer 61. The first AlN layer is formed by, for example, hydride vapor phase epitaxy. For example, a second AlN layer is used as the second buffer layer 62. The second AlN layer is formed by, for example, MOCVD.

The first n-side layer 11 and the second n-side layer 12 are formed in order on the second buffer layer 62. Thereby, the n-type semiconductor layer 10 is formed. The light emitting unit 30 is formed on the n-type semiconductor layer 10. The first layer 41, the second layer 42, and the third layer 43 are formed in this order on the light emitting unit 30. Thereby, the stacked unit 40 is formed. Further, the first p-side layer 21 and the second p-side layer 22 are formed in this order on the stacked unit 40. Thereby, the p-type semiconductor layer 20 is formed. The formation of these layers includes, for example, MOCVD. The multilayered structural body 35 (not shown) may be formed on the n-type semiconductor layer 10; and the light emitting unit 30 may be formed on the multilayered structural body 35.

The substrate 50 and the buffer unit 60 are removed. The first electrode 70 is formed on the surface (the second major surface 10b) of the n-type semiconductor layer 10 (e.g., the first n-side layer 11) that is exposed by removing the buffer unit 60. The second electrode 80 is formed on the p-type semiconductor layer 20.

In the example, the unevenness 10dp is formed in the second major surface 10b of the n-type semiconductor layer 10. The formation of the unevenness 10dp includes, for example, at least one selected from lithography, etching, UV light irradiation, and wet etching. By forming the unevenness 10dp, for example, the light extraction efficiency can be high. For example, in the case where the second p-side layer 22 includes AlGaN and the second electrode 80 includes Al, the light extraction efficiency can be even higher because the reflectance is high and the absorption of the light is small.

For example, in the case where an AlN layer that is used to form the buffer unit 60 is formed by MOCVD, the buffer unit 60 that is formed includes a lot of a C (carbon) impurity. There are cases where the light extraction efficiency decreases due to, for example, a portion of the light emitted from the light emitting unit 30 being absorbed or scattered due to the C impurity.

In the semiconductor light emitting element 130, the buffer unit 60 is removed. Therefore, the effects of the light absorption and/or scattering due to the C impurity are suppressed; and the decrease of the light extraction efficiency is suppressed.

In the case where an AlN layer is formed by MOCVD as the buffer unit 60, the thickness of the AlN layer is set to be, for example, about 3 to 4 times the peak wavelength of the light emitted from the light emitting unit 30. Thereby, even in the case where the buffer unit 60 is not removed, the effects of the light absorption and/or scattering can be reduced.

In the semiconductor light emitting element 130, for example, the light acquisition amount from the n-type semiconductor layer 10 side is high. In the semiconductor light emitting element 130, the efficiency of the light emitting unit 30 is high. The external quantum efficiency can be high by increasing the light extraction efficiency. The energy loss in the element interior can be suppressed. The amount of heat generated by the semiconductor light emitting element 130 can be reduced; and the element characteristics improve.

For example, in the case where the light emission wavelength is 365 nm or less, the absorption by the GaN is large. In such a case, the n-type semiconductor layer 10 includes a material that includes Al and has a bandgap greater than the light emission wavelength. In such a case, there is absorption due to the impurities of such a layer; and the thickness of the n-type semiconductor layer 10 is a thickness appropriate to suppress the light absorption while suppressing the resistivity increase. It is favorable for the thickness of the n-type semiconductor layer 10 to be not less than 2 μm and not more than 6 μm.

In the semiconductor light emitting element 130, for example, the second electrode 80 side may be bonded to a heat-dissipating member having a high thermal conductivity. In the semiconductor light emitting element 130, for example, the distance between the heat-dissipating member and the light emitting unit 30 is short because the thickness of the entirety is thin; and the heat can escape easily. Higher effects can be obtained.

By providing the heat-dissipating member, the temperature increase is prevented; and it is easy to maintain the state in which the efficiency of the semiconductor light emitting element is high. The temperature increase of the light emitting unit 30 is small; the luminous efficiency of the light emitting unit 30 can be maintained at a high level; and high-output operations are possible.

For example, for a nitride semiconductor having a high Al composition ratio, the resistance does not decrease easily even when an impurity is added because the proportion of the nitride semiconductor that functions as carriers to allow the current to flow is low. In the case where an impurity is added excessively, the absorption coefficient for the emitted light increases; and the light extraction efficiency decreases. The absorption coefficient increases abruptly when the temperature of the region where the impurity is added increases due to heat generation. Therefore, the suppression of the temperature increase due to the heat generation is important. In the configuration of the semiconductor light emitting element 130, the heat generation region can be proximal to heat-dissipating members having high thermal conductivity; and as a result, highly efficient high-output operations are easy.

Second Embodiment

The embodiment relates to a method for manufacturing the semiconductor light emitting element. For example, the methods for manufacturing the semiconductor light emitting elements described above are applicable to the manufacturing method.

Figure 17:
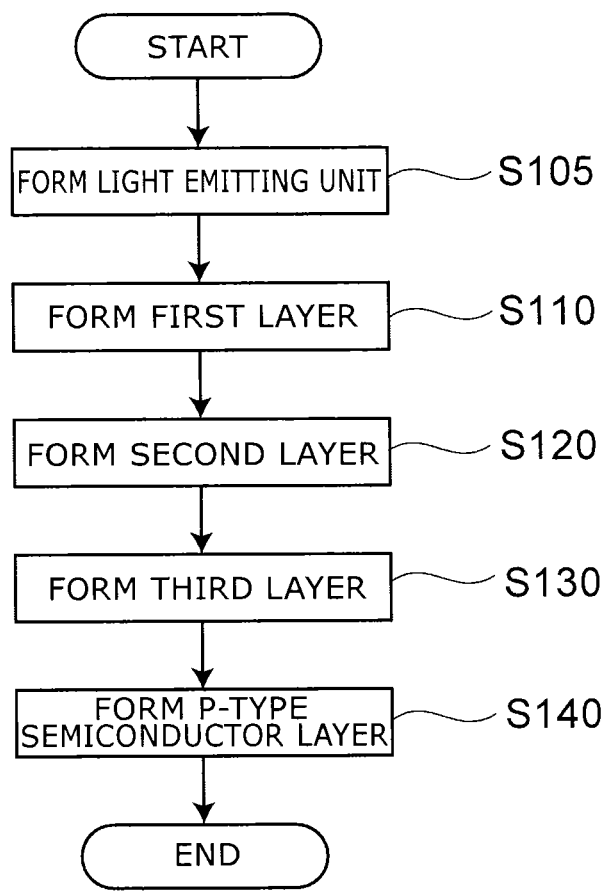
FIG. 17 is a flowchart showing the method for manufacturing the semiconductor light emitting element according to the second embodiment.

FIG. 17 is a flowchart illustrating the method for manufacturing the semiconductor light emitting element according to the second embodiment.

The method for manufacturing the semiconductor light emitting element according to the embodiment includes forming the light emitting unit 30 including the first well layer WL1 including a nitride semiconductor on the n-type semiconductor layer 10 including a nitride semiconductor (step S105).

The manufacturing method further includes forming the first layer 41 (step S110), forming the second layer 42 (step S120), and forming the third layer 43 (step S130). Further, the p-type semiconductor layer 20 that includes a nitride semiconductor is formed on the third layer 43 (step S140).

The formation of the first layer 41 includes forming the first layer 41 of $Al_{x1}Ga_{1-x1-y1}In_{y1}N$ ($0<x1<1$, $0 \le y1<1$, and $x1+y1 \le 1$) having the first Mg concentration Mc1 on the light emitting unit 30. The formation of the second layer 42 includes forming the second layer 42 of $Al_{x2}Ga_{1-x2-y2}In_{y2}N$ ($0 \le x2<x1$, $0 \le y2<1$, and $x2+y2 \le 1$) having the second Mg concentration Mc2 that is higher than the first Mg concentration Mc1 on the first layer 41. The formation of the third layer 43 includes forming the third layer 43 of $Al_{x3}Ga_{1-x3-y3}In_{y3}N$ ($x1<x3<1$, $0 \le y3<1$, and $x3+y3 \le 1$) having the third Mg concentration Mc3 that is higher than the first Mg concentration Mc1 and lower than the second Mg concentration Mc2 on the second layer 42. For example, the formation temperature of the third layer 43 is higher than the formation temperature of the second layer 42.

Or, the formation of the first layer 41 includes forming the first layer 41 of $Al_{x1}Ga_{1-x1-y1}In_{y1}N$ ($0 \le x1<1$, $0 \le y1<1$, and $x1+y1 \le 1$) having the first Mg concentration Mc1 on the light emitting unit 30. The formation of the second layer 42 includes forming the second layer 42 of $Al_{x2}Ga_{1-x2-y2}In_{y2}N$ ($0 \le x2 \le x1$, $y1<y2<1$, and $x2+y2 \le 1$) having the second Mg concentration Mc2 that is higher than the first Mg concentration Mc1 on the first layer 41. The formation of the third layer 43 includes forming the third layer 43 of $Al_{x3}Ga_{1-x3-y3}In_{y3}N$ ($x1<x3<1$, $0<y3<1$, and $x3+y3 \le 1$) having the third Mg concentration Mc3 that is higher than the first Mg concentration Mc1 and lower than the second Mg concentration Mc2 on the second layer 42. For example, the temperature of the formation of the third layer 43 is higher than the formation temperature of the second layer 42.

The formation temperature of the second layer 42 is, for example, 860° C. The formation temperature of the third layer 43 is, for example, not less than 1000° C. and not more than 1050° C.

According to the manufacturing method according to the embodiment, a method for manufacturing a semiconductor light emitting element having a high efficiency can be provided.

According to the embodiments, a semiconductor light emitting element and a method for manufacturing the semiconductor light emitting element having a high efficiency can be provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the semiconductor light emitting element and the method for manufacturing the semiconductor light emitting element such as the substrate, the buffer unit, the n-type semiconductor layer, the light emitting unit, the stacked unit, the p-type semiconductor layer, the first electrode, the second electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting elements and methods for manufacturing semiconductor light emitting elements practicable by an appropriate design modification by one skilled in the art based on the semiconductor light emitting elements and the methods for manufacturing the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
   an n-type semiconductor layer including a nitride semiconductor;
   a p-type semiconductor layer including a nitride semiconductor;
   a light emitting unit provided between the n-type semiconductor layer and the p-type semiconductor layer, the light emitting unit including a first well layer including a nitride semiconductor;
   a first layer provided between the first well layer and the p-type semiconductor layer, the first layer including $Al_{x1}Ga_{1-x1-y1}In_{y1}N$ ($0<x1<1$, $0 \le y1<1$, and $x1+y1 \le 1$) having a first Mg concentration;
   a second layer provided between the first layer and the p-type semiconductor layer, the second layer including $Al_{x2}Ga_{1-x2-y2}In_{y2}N$ ($0 \le x2<x1$, $0 \le y2<1$, and $x2+y2 \le 1$) and Mg, the second layer having a second Mg concentration higher than the first Mg concentration; and
   a third layer provided between the second layer and the p-type semiconductor layer, the third layer including $Al_{x3}Ga_{1-x3-y3}In_{y3}N$ ($x1<x3<1$, $0 \le y3<1$, and $x3+y3 \le 1$) and Mg, the third layer having a third Mg concentration higher than the first Mg concentration and lower than the second Mg concentration.

2. The element according to claim 1, wherein
the first well layer includes In,
the y1 is lower than an In composition ratio of the first well layer,
the y2 is lower than the In composition ratio of the first well layer, and
the y3 is lower than the In composition ratio of the first well layer.

3. The element according to claim 1, wherein a bandgap energy of the first layer is larger than a bandgap energy of the first well layer.

4. The element according to claim 1, wherein a bandgap energy of the second layer is smaller than a bandgap energy of the first layer.

5. The element according to claim 1, wherein a bandgap energy of the second layer is larger than a bandgap energy of the first well layer.

6. The element according to claim 1, wherein a bandgap energy of the third layer is larger than a bandgap energy of the first layer.

7. The element according to claim 1, wherein the first layer contacts the first well layer.

8. The element according to claim 1, wherein a thickness of the third layer is thinner than a thickness of the p-type semiconductor layer.

9. The element according to claim 1, wherein
the third layer includes:
   a plurality of high Al composition layers; and
   a low Al composition layer provided between the high Al composition layers, and
an Al composition ratio of the low Al composition layer is lower than Al composition ratios of the high Al composition layers.

10. The element according to claim 1, wherein
the x2 is not more than 0.2, and
the y2 is not more than 0.15.

11. The element according to claim 1, wherein
the x2 is not less than 0.08 and not more than 0.15, and
the y2 is not more than 0.15.

12. The element according to claim 1, wherein
the x2 is greater than 0.6 and not more than 0.8, and
the y2 is not more than 0.05.

13. The element according to claim 1, wherein
the x2 is not less than 0.63 and not more than 0.7, and
the y2 is not more than 0.05.

14. The element according to claim 1, wherein the light emitting unit further includes:
a second well layer provided between the n-type semiconductor layer and the first well layer, the second well layer including a nitride semiconductor; and
a barrier layer provided between the first well layer and the second well layer.

15. The element according to claim 1, wherein
a thickness of the first layer is thinner than a thickness of the third layer, and
a thickness of the second layer is thinner than the thickness of the third layer.

16. The element according to claim 15, wherein the thickness of the first layer is thicker than the thickness of the second layer.

17. A semiconductor light emitting element, comprising:
an n-type semiconductor layer including a nitride semiconductor;
a p-type semiconductor layer including a nitride semiconductor;
a light emitting unit provided between the n-type semiconductor layer and the p-type semiconductor layer, the light emitting unit including a first well layer including a nitride semiconductor;
a first layer provided between the first well layer and the p-type semiconductor layer, the first layer including $Al_{x1}Ga_{1-x1-y1}In_{y1}N$ ($0 \le x1 < 1$, $0 \le y1 < 1$, and $x1+y1 \le 1$) having a first Mg concentration;
a second layer provided between the first layer and the p-type semiconductor layer, the second layer including $Al_{x2}Ga_{1-x2-y2}In_{y2}N$ ($0 \le x2 \le x1$, $y1 < y2 < 1$, and $x2+y2 \le 1$) and Mg, the second layer having a second Mg concentration higher than the first Mg concentration; and
a third layer provided between the second layer and the p-type semiconductor layer, the third layer including $Al_{x3}Ga_{1-x3-y3}In_{y3}N$ ($x1 < x3 < 1$, $0 < y3 < 1$, and $x3+y3 \le 1$) and Mg, the third layer having a third Mg concentration higher than the first Mg concentration and lower than the second Mg concentration.

18. The element according to claim 17, wherein
the first well layer includes In, and
the y2 is lower than an In composition ratio of the first well layer.

19. The element according to claim 17, wherein a bandgap energy of the first layer is larger than a bandgap energy of the first well layer.

20. The element according to claim 17, wherein a bandgap energy of the second layer is smaller than a bandgap energy of the first layer.

21. The element according to claim 17, wherein a bandgap energy of the second layer is larger than a bandgap energy of the first well layer.

22. The element according to claim 17, wherein a bandgap energy of the third layer is larger than a bandgap energy of the first layer.

23. The element according to claim 17, wherein the first layer contacts the first well layer.

24. The element according to claim 17, wherein
a thickness of the first layer is thinner than a thickness of the third layer, and
a thickness of the second layer is thinner than the thickness of the third layer.

25. The element according to claim 17, wherein the thickness of the first layer is thicker than the thickness of the second layer.

26. The element according to claim 17, wherein a thickness of the third layer is thinner than a thickness of the p-type semiconductor layer.

27. The element according to claim 17, wherein the third layer includes:
a plurality of high Al composition layers; and
a low Al composition layer provided between the high Al composition layers, and
an Al composition ratio of the low Al composition layer is lower than Al composition ratios of the high Al composition layers.

28. The element according to claim 17, wherein the x2 is not more than 0.2, and the y2 is not more than 0.15.

29. The element according to claim 17, wherein the x2 is not less than 0.08 and not more than 0.15, and the y2 is not more than 0.15.

30. The element according to claim 17, wherein the x2 is greater than 0.6 and not more than 0.8, and the y2 is not more than 0.05.

31. The element according to claim 17, wherein the x2 is not less than 0.63 and not more than 0.7, and the y2 is not more than 0.05.

32. The element according to claim 17, wherein the light emitting unit further includes:
- a second well layer provided between the n-type semiconductor layer and the first well layer, the second well layer including a nitride semiconductor; and
- a barrier layer provided between the first well layer and the second well layer.

* * * * *